United States Patent
Qin et al.

(10) Patent No.: US 12,254,943 B2
(45) Date of Patent: Mar. 18, 2025

(54) SIGNAL DETECTION SYSTEM FOR DUTY CYCLE TESTING AND MEMORY DETECTION METHOD

(71) Applicant: CHANGXIN MEMORY TECHNOLOGIES, INC., Hefei (CN)

(72) Inventors: Jianyong Qin, Hefei (CN); Jianni Li, Hefei (CN); Zhonglai Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 268 days.

(21) Appl. No.: 17/955,670

(22) Filed: Sep. 29, 2022

(65) Prior Publication Data
US 2023/0012586 A1   Jan. 19, 2023

Related U.S. Application Data

(63) Continuation of application No. PCT/CN2022/093714, filed on May 19, 2022.

(30) Foreign Application Priority Data

Apr. 26, 2022 (CN) .......................... 202210450141.8

(51) Int. Cl.
G11C 29/50 (2006.01)
G11C 7/22 (2006.01)
(Continued)

(52) U.S. Cl.
CPC ........ G11C 29/50012 (2013.01); G11C 7/222 (2013.01); H03K 5/1565 (2013.01); H03K 3/0315 (2013.01)

(58) Field of Classification Search
CPC . G11C 29/50012; G11C 7/222; G11C 29/023; G11C 29/028; H03K 5/1565; H03K 3/0315
See application file for complete search history.

(56) References Cited

U.S. PATENT DOCUMENTS 6,671,652 B2   12/2003   Watson, Jr.
6,721,114 B1    4/2004   Sutardja
(Continued)

FOREIGN PATENT DOCUMENTS

CN   1416215 A    5/2003
CN   1677820 A   10/2005
(Continued)

OTHER PUBLICATIONS

JEDEC JESD209-4B, Low Power Double Data Rate 4 (LPDDR4), JEDEC Solid State Technology Association, Feb. 2017, 307 pages.
(Continued)

*Primary Examiner* — Jerome Leboeuf
(74) *Attorney, Agent, or Firm* — Syncoda LLC; Feng Ma

(57) ABSTRACT

A signal detection system and a memory detection method are provided. The system includes a signal generator, generating a reference test signal based on an external parameter, the reference test signal being a clock signal satisfying a preset duty cycle, where a duty cycle test is performed on the reference test signal based on a test circuit, to determine whether a function of the test circuit is normal. If the function of the test circuit is normal, different portions under test are sequentially selected based on a test control signal, and the duty cycle test is performed, based on the test circuit, on a signal outputted by each of the selected portions under test. The portions under test include a signal converter and a write clock path.

20 Claims, 21 Drawing Sheets

(51) Int. Cl.
*H03K 5/156* (2006.01)
*H03K 3/03* (2006.01)

(56) References Cited

U.S. PATENT DOCUMENTS

| | | |
|---|---|---|
| 6,927,641 B2 | 8/2005 | Terasawa |
| 7,567,118 B2 | 7/2009 | Azuma |
| 9,448,274 B2 | 9/2016 | Pounds |
| 10,164,572 B2 | 12/2018 | Chen |
| 10,885,989 B1 | 1/2021 | Moon |
| 11,005,479 B2 | 5/2021 | Im |
| 11,349,457 B2 | 5/2022 | Kim |
| 11,496,136 B1 | 11/2022 | Park |
| 2003/0020529 A1 | 1/2003 | Nakanishi |
| 2003/0098749 A1 | 5/2003 | Terasawa |
| 2003/0219089 A1 | 11/2003 | Ho |
| 2005/0094448 A1 | 5/2005 | Lee |
| 2005/0218966 A1 | 10/2005 | Azuma |
| 2007/0223638 A1 | 9/2007 | Okamura |
| 2007/0271068 A1 | 11/2007 | Boerstler et al. |
| 2008/0005606 A1 | 1/2008 | Koo |
| 2010/0219870 A1 | 9/2010 | Kikuchi |
| 2011/0156757 A1 | 6/2011 | Hayashi |
| 2011/0181308 A1 | 7/2011 | Ishida |
| 2015/0078101 A1* | 3/2015 | Becker ............... G11C 7/222 |
| | | 327/156 |
| 2015/0301104 A1 | 10/2015 | Pounds et al. |
| 2017/0117887 A1* | 4/2017 | Lee ............... H03K 5/1565 |
| 2017/0222796 A1 | 8/2017 | Chen et al. |
| 2018/0054163 A1 | 2/2018 | Chen et al. |
| 2019/0181847 A1 | 6/2019 | Satoh et al. |
| 2020/0160902 A1* | 5/2020 | Gans ............... G11C 29/023 |
| 2020/0162066 A1* | 5/2020 | Gans ............... H03K 5/1565 |
| 2020/0336148 A1 | 10/2020 | Im et al. |
| 2022/0094339 A1 | 3/2022 | Kim et al. |
| 2022/0130439 A1 | 4/2022 | Tian et al. |
| 2022/0247390 A1 | 8/2022 | Kim et al. |
| 2022/0336004 A1* | 10/2022 | Yoon ............... H03K 5/1565 |

FOREIGN PATENT DOCUMENTS

| | | |
|---|---|---|
| CN | 101826860 A | 9/2010 |
| CN | 101410719 B | 1/2012 |
| CN | 102638247 A | 8/2012 |
| CN | 103840796 A | 6/2014 |
| CN | 103997317 A | 8/2014 |
| CN | 104753524 A | 7/2015 |
| CN | 106233150 A | 12/2016 |
| CN | 107153138 A | 9/2017 |
| CN | 109274356 A | 1/2019 |
| CN | 209087409 U | 7/2019 |
| CN | 111161771 A | 5/2020 |
| CN | 111193498 A | 5/2020 |
| CN | 210899108 U | 6/2020 |
| CN | 111835349 A | 10/2020 |
| CN | 111863048 A | 10/2020 |
| CN | 112420113 A | 2/2021 |
| CN | 113346739 A | 9/2021 |
| CN | 113764028 A | 12/2021 |
| CN | 215773547 U | 2/2022 |
| CN | 114257235 A | 3/2022 |
| CN | 114420187 A | 4/2022 |
| EP | 3886099 A1 | 9/2021 |
| WO | 2015037252 A1 | 3/2015 |

OTHER PUBLICATIONS

JEDEC JESD209-5B, Low Power Double Data Rate 5 (LPDDR5), JEDEC Solid State Technology Association, Jun. 2021, 552 pages.
Kyu-hyoun kim, A 20-GB/s 256-Mb DRAM with an Inductorless Quadrature PLL and a Cascaded Pre-emphasis Transmitter, JSSC, Jan. 2006, 8 pages.
Non-Final Office Action of the U.S. Appl. No. 17/866,682, issued on Jan. 17, 2023, 9 pgs.

* cited by examiner

US 12,254,943 B2

SIGNAL DETECTION SYSTEM FOR DUTY CYCLE TESTING AND MEMORY DETECTION METHOD

CROSS-REFERENCE TO RELATED APPLICATION

This application is a continuation of International patent application No. PCT/CN2022/093714, filed on May 19, 2022, which claims priority to Chinese patent application No. 202210450141.8, entitled "SIGNAL DETECTION SYSTEM AND MEMORY DETECTION METHOD" and filed on Apr. 26, 2022. The disclosures of International patent application No. PCT/CN2022/093714 and Chinese patent application No. 202210450141.8 are hereby incorporated by reference in their entireties.

TECHNICAL FIELD

The disclosure relates to the field of semiconductor circuit design, and in particular to a signal detection system and a memory detection method.

BACKGROUND

With the progress of technology, high-tech products are constantly updated, and product performance keeps improving. A high-tech product cannot operate without a memory for data storage. Therefore, nowadays it becomes an urgent problem to improve the data access rate and data access stability of a memory.

A clock signal is used in data processing in a memory. The transmission frequency of the clock signal determines the number of operations performed by the memory within the same time, that is, determines the speed of data processing in the memory. That is, data processing is performed in the memory based on a high-speed clock signal, which is of great significance for improving the performance of the memory.

How to test whether the duty cycle of a high-speed clock signal meets requirements, how to ensure the accuracy of testing a high-speed clock signal, and how to generate equidistant parallel clock signals based on a high-speed clock signal are urgent problems to be resolved at present.

SUMMARY

Embodiments of the disclosure provide a signal detection system, applied to a memory, configured to perform a duty cycle test on output signals of test paths in the memory according to a test circuit in the memory, and including: a signal generator, generating a reference test signal based on an external parameter, the reference test signal being a clock signal satisfying a preset duty cycle, where the duty cycle test is performed on the reference test signal based on the test circuit, to determine whether a function of the test circuit is normal; if the function of the test circuit is normal, different portions under test are sequentially selected based on a test control signal, and the duty cycle test is performed, based on the test circuit, on a signal outputted by each of the selected portions under test: the portions under test include a signal converter and a write clock path: the signal conversion circuit is configured to generate an internal clock signal according to the reference test signal; and the write clock path includes a write frequency divider, a write clock tree, and a signal loading circuit; and the write frequency divider is configured to generate a parallel write clock according to the internal clock signal, the write clock tree is configured to adjust a delay of the parallel write clock, and the signal loading circuit is configured to sample preset data according to the parallel write clock, to generate a first indication signal and a second indication signal.

BRIEF DESCRIPTION OF THE DRAWINGS

One or more embodiments are exemplarily described by using a diagram that corresponds to the one or more embodiments in the accompanying drawings. These exemplary descriptions do not constitute a limitation to the embodiments. Unless specifically indicated, the diagrams in the accompanying drawings do not constitute any limitations on proportions. To describe the technical solutions of the embodiments of the disclosure or conventional technologies more clearly, the following briefly describes the accompanying drawings required for the embodiments. Apparently, the accompanying drawings in the following description show only some embodiments of the disclosure, and a person of ordinary skill in the art may still derive other drawings from these accompanying drawings without creative efforts.

DETAILED DESCRIPTION

How to test whether the duty cycle of a high-speed clock signal meets requirements, how to ensure the accuracy of testing a high-speed clock signal, and how to generate equidistant parallel clock signals based on the high-speed clock signal are urgent problems to be solved at present.

An embodiment of the disclosure provides a signal detection system. Different test paths are selected to test whether duty cycles of a high-speed clock signal in different transmission paths meets requirements, to ensure the stability of data processing in a memory.

A person of ordinary skill in the art may understand that in the embodiments of the disclosure, many technical details are provided for a reader to better understand the disclosure. However, even in the absence of these technical details and various changes and modifications based on the following embodiments, the technical solution that the disclosure seek to protect can be implemented. The divisions in the following embodiments are for ease of description but should not constitute any limitation to specific embodiments of the disclosure. Various embodiments may be combined with each other or used as references for each other without causing any conflict.

The signal detection system provided in this embodiment is further described below in detail with reference to the accompanying drawings. Details are as follows:

A signal detection system 1000 is applied to a memory, and is configured to perform a duty cycle test on output signals of test paths in the memory according to a test circuit in the memory.

Figure 1:
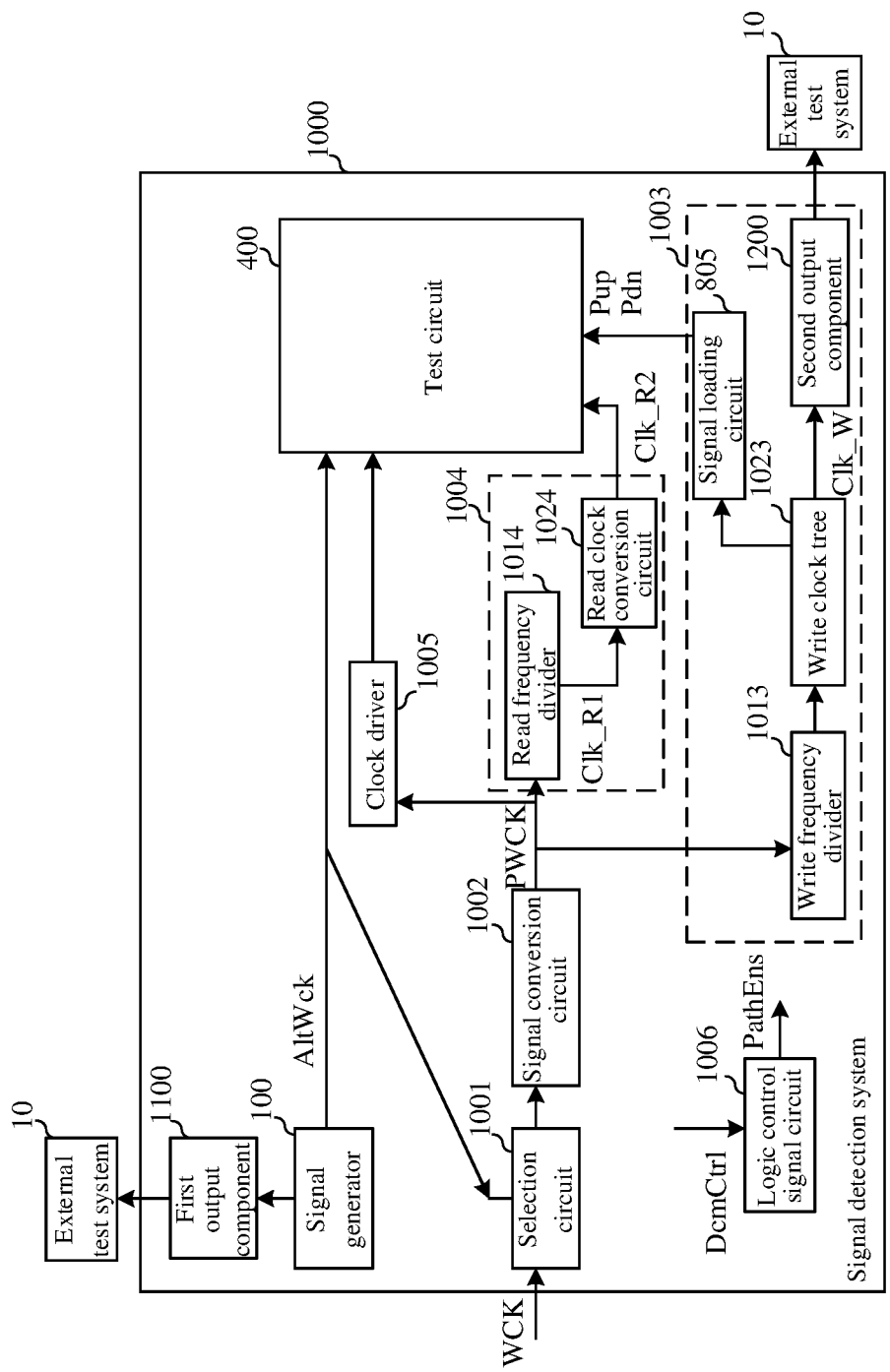
FIG. 1 is a schematic structural diagram of a signal detection system according to an embodiment of the disclosure.

Referring to FIG. 1, the signal detection system 1000 includes:

a signal generator 100, configured to generate a reference test signal AltWck based on an external parameter, the reference test signal AltWck being a clock signal satisfying a preset duty cycle.

The duty cycle test is performed on the reference test signal AltWck based on a test circuit 400, to determine whether a function of the test circuit 400 is normal. If the function of the test circuit 400 is normal, different portions under test are sequentially selected based on a test control signal DemCtrl, and the duty cycle test is performed, based on the test circuit 400, on a signal outputted by each of the selected portions under test.

The portions under test include a signal conversion circuit 1002 and a write clock path 1003. The signal conversion circuit 1002 is configured to generate an internal clock signal PWCK according to the reference test signal AltWck. The write clock path 1003 includes a write frequency divider 1013, a write clock tree 1023, and a signal loading circuit 805. The write frequency divider 1013 is configured to generate a parallel write clock Clk_W according to the internal clock signal PWCK. The write clock tree 1023 has an input terminal connected to an output terminal of the write frequency divider 1013 and is configured to adjust a delay of an input signal and generate a parallel write clock Clk_W. The signal loading circuit 805 has an input terminal connected to an output terminal of the write clock tree 1023 and an output terminal connected to the test circuit 400, and is configured to sample preset data according to the parallel write clock Clk_W, to generate a first indication signal Pup and a second indication signal Pdn.

The duty cycle test is performed on the reference test signal AltWck based on the test circuit 400. A duty cycle of the reference test signal AltWck is known and is used for determining whether a duty cycle test function of the test circuit 400 is normal. If the duty cycle test function of the test circuit 400 is normal, different portions under test are selected based on the test control signal DemCtrl, and duty cycles of output signals of the different portions under test are sequentially tested by using the test circuit 400, to test whether the duty cycle of the output signal of each of the different portions under test is normal, thereby completing function test for the different portions under test.

Continuing to refer to FIG. 1, in some embodiments, the portions under test further include a read clock path 1004. The read clock path 1004 includes a read frequency divider 1014 and a read clock conversion circuit 1024. The read frequency divider 1014 is configured to generate a parallel read clock Clk_R1 according to the internal clock signal PWCK. The read clock conversion circuit 1024 is configured to generate a serial read clock Clk_R2 according to the parallel read clock Clk_R1.

It needs to be noted that in some embodiments, the write frequency divider 1013 and the read frequency divider 1014 in the memory may be implemented based on one frequency divider.

Figure 2:
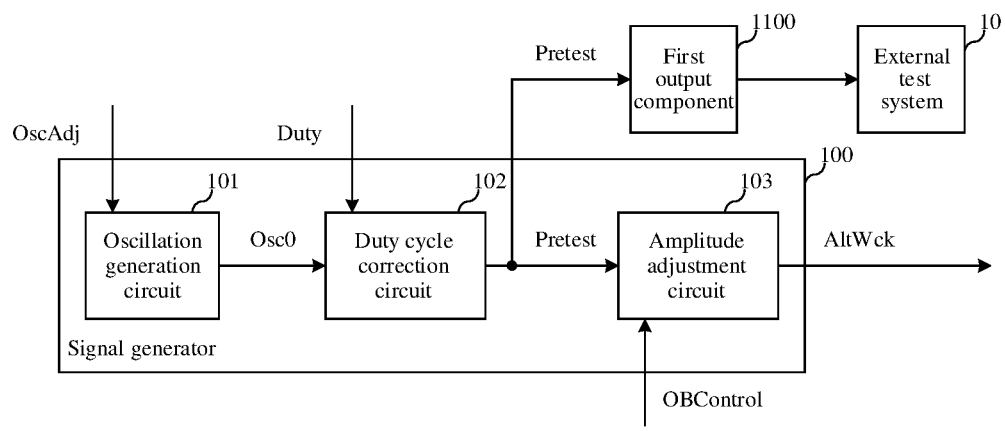
FIG. 2 is a schematic structural diagram of a signal generator according to an embodiment of the disclosure.

For the signal generator 100, referring to FIG. 2, the signal generator 100 includes:

an oscillation generation circuit 101, configured to generate an initial oscillation signal Osc0 based on an oscillation control signal OscAdj, the oscillation control signal OscAdj being used for adjusting a frequency of the generated initial oscillation signal Osc0;

a duty cycle correction circuit 102, connected to an output terminal of the oscillation generation circuit 101, the duty cycle correction circuit 102 being configured to adjust a duty cycle of the initial oscillation signal Osc0 based on a duty cycle control signal Duty to generate an intermediate test signal Pretest; and an amplitude adjustment circuit 103, connected to an output terminal of the duty cycle correction circuit 102, the amplitude adjustment circuit 103 being configured to adjust an amplitude of the intermediate test signal Pretest based on an amplitude control signal OBControl to generate the reference test signal AltWck.

Figure 3:
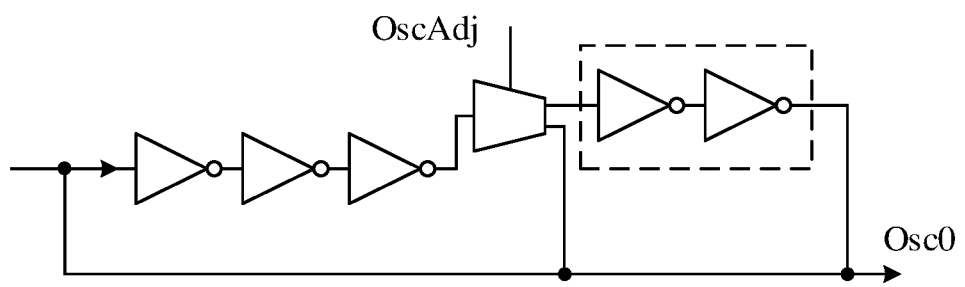
FIG. 3 is a schematic structural diagram of a ring oscillator according to an embodiment of the disclosure.
Figure 4:
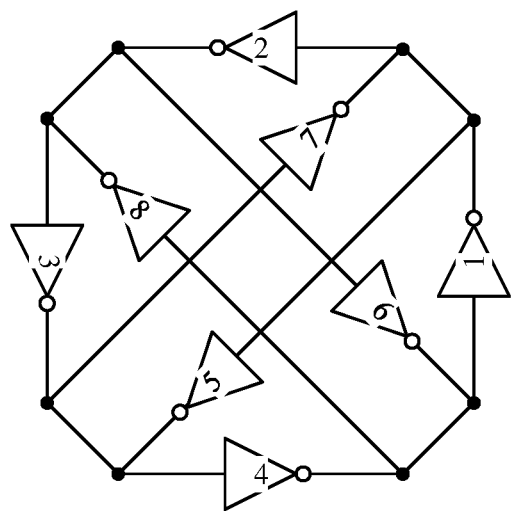
FIG. 4 is a schematic structural diagram of a tetrahedral oscillator according to an embodiment of the disclosure.

For the oscillation generation circuit 101, referring to FIG. 3, in some embodiments, the oscillation generation circuit 101 includes a ring oscillator. The ring oscillator is configured to generate the initial oscillation signal Osc0 based on the oscillation control signal OscAdj. The oscillation control signal OscAdj is used for adjusting a number of inverters connected to the ring oscillator. It may be understood that the number of inverters connected to the ring oscillator is related to an oscillation frequency of the initial oscillation signal Osc0. Specifically, when more inverters are connected to the ring oscillator, the oscillation frequency of the initial oscillation signal Osc0 is lower. Referring to FIG. 4, in some embodiments, the oscillation generation circuit 101 includes a tetrahedral oscillator. The tetrahedral oscillator includes inner ring inverters and outer ring inverters. The outer ring inverters have the same driving capability. The inner ring inverters have the same driving capability. The driving capability of the inner ring inverters is 0.3 to 0.8 times the driving capability of the outer ring inverters. For the tetrahedral oscillator, the tetrahedral oscillator is configured to generate the initial oscillation signal Osc0 based on the oscillation control signal OscAdj, and the oscillation control signal OscAdj is used for adjusting the driving capability of the inner ring inverters. In an example, the oscillation control signal OscAdj is used for adjusting the driving capability of transistors forming the inner ring inverters to adjust the driving capability of the inner ring inverters. It may be understood that when the driving capability of the inner ring inverters in the tetrahedral oscillator is higher, a delay caused by the inverters is shorter, and the frequency of the initial oscillation signal Osc0 generated by the oscillation generation circuit 101 is higher. During actual application, a ratio of the driving capability of the inner ring inverters to the driving capability of the outer ring inverters may be changed to control the frequency of the initial oscillation signal Osc0 generated by the oscillation generation circuit 101. In an example, the driving capability of the inner ring inverters may be set to 0.4 times, 0.5 times, 0.6 times or 0.7 times the driving capability of the outer ring inverters. Preferably, the driving capability of the inner ring inverters is set to 0.7 times the driving capability of the outer ring inverters, to increase the frequency of the initial oscillation signal Osc0 generated by the oscillation generation circuit 101. In a specific example, the outer ring inverters include a first inverter 1, a second inverter 2, a third inverter 3, and a fourth inverter 4. The inner ring inverters include a fifth inverter 5, a sixth inverter 6, a seventh inverter 7, and an eighth inverter 8. An output terminal of the first inverter 1 is connected to an input terminal of the second inverter 2. An output terminal of the second inverter 2 is connected to an input terminal of the third inverter 3. An output terminal of the third inverter 3 is connected to an input terminal of the fourth inverter 4. An output terminal of the fourth inverter 4 is connected to an input terminal of the first inverter 1. The fifth inverter 5 has an input terminal connected to the output terminal of the first inverter 1 and an output terminal connected to the input terminal of the fourth inverter 4. The sixth inverter 6 has an input terminal connected to the output terminal of the second inverter 2 and an output terminal connected to the input terminal of the first inverter 1. The seventh inverter 7 has an input terminal connected to the output terminal of the third inverter 3 and an output terminal connected to the input terminal of the second inverter 2. The eighth inverter 8 has an input terminal connected to the output terminal of the fourth inverter 4 and an output terminal connected to the input terminal of the third inverter 3.

Figure 5:
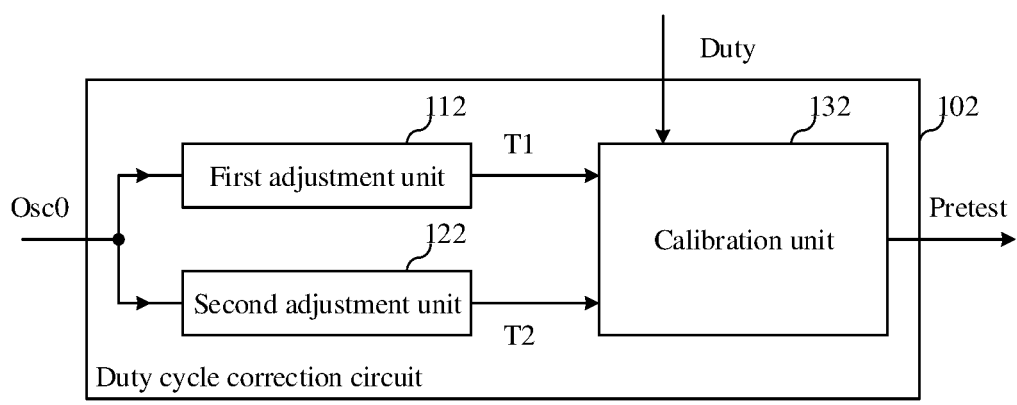
FIG. 5 is a schematic structural diagram of a duty cycle correction circuit according to an embodiment of the disclosure.

For the duty cycle correction circuit 102, referring to FIG. 5, the duty cycle correction circuit 102 includes: a first adjustment unit 112, connected to the oscillation generation circuit 101, the first adjustment unit 112 being configured to increase the duty cycle of the initial oscillation signal Osc0 to generate a first adjustment signal T1; a second adjustment unit 122, connected to the oscillation generation circuit 101, the second adjustment unit 122 being configured to decrease the duty cycle of the initial oscillation signal Osc0 to generate a second adjustment signal T2; and a calibration unit 132, connected to the first adjustment unit 112 and the second adjustment unit 122, the calibration unit 132 being configured to generate the intermediate test signal Pretest according to the duty cycle control signal Duty, the first adjustment signal T1, and the second adjustment signal T2. The duty cycle control signal Duty is used for adjusting a signal proportion of the first adjustment signal T1 and a signal proportion of the second adjustment signal T2 in the generated intermediate test signal Pretest.

Figure 6:
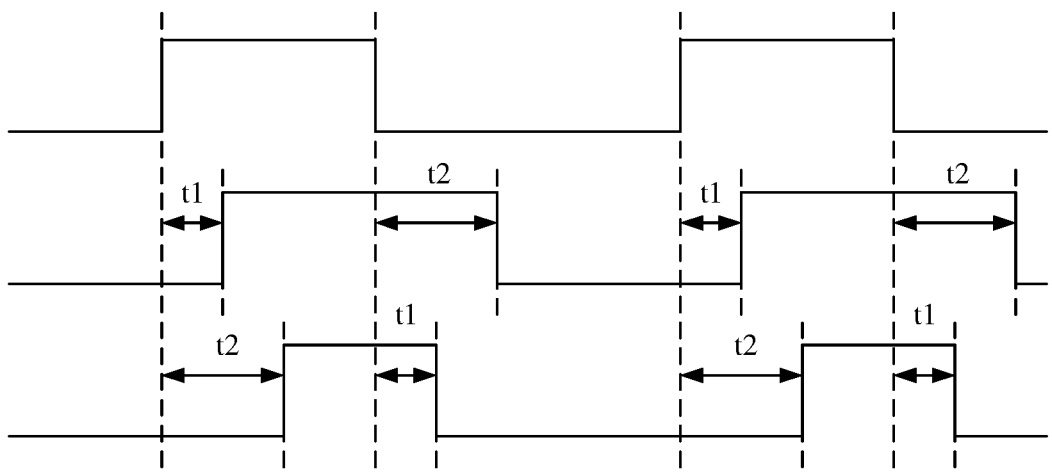
FIG. 6 is a schematic diagram of the correction principle of a first adjustment unit and a second adjustment unit according to an embodiment of the disclosure.

For the first adjustment unit 112 and the second adjustment unit 122, referring to FIG. 6, the first adjustment unit 112 and the second adjustment unit 122 delay a rising edge and a falling edge of a signal to different degrees to adjust the duty cycle of the signal. For example, a rising edge of an initial signal is delayed by t1, and a falling edge of the initial signal is delayed by t2. When t1>t2, an interval between the rising edge and the falling edge of the signal after the delays is shortened, and the duty cycle of the signal is reduced. When t1<t2, the interval between the rising edge and the falling edge of the signal after the delays is extended, and the duty cycle of the signal is increased.

Figure 7:
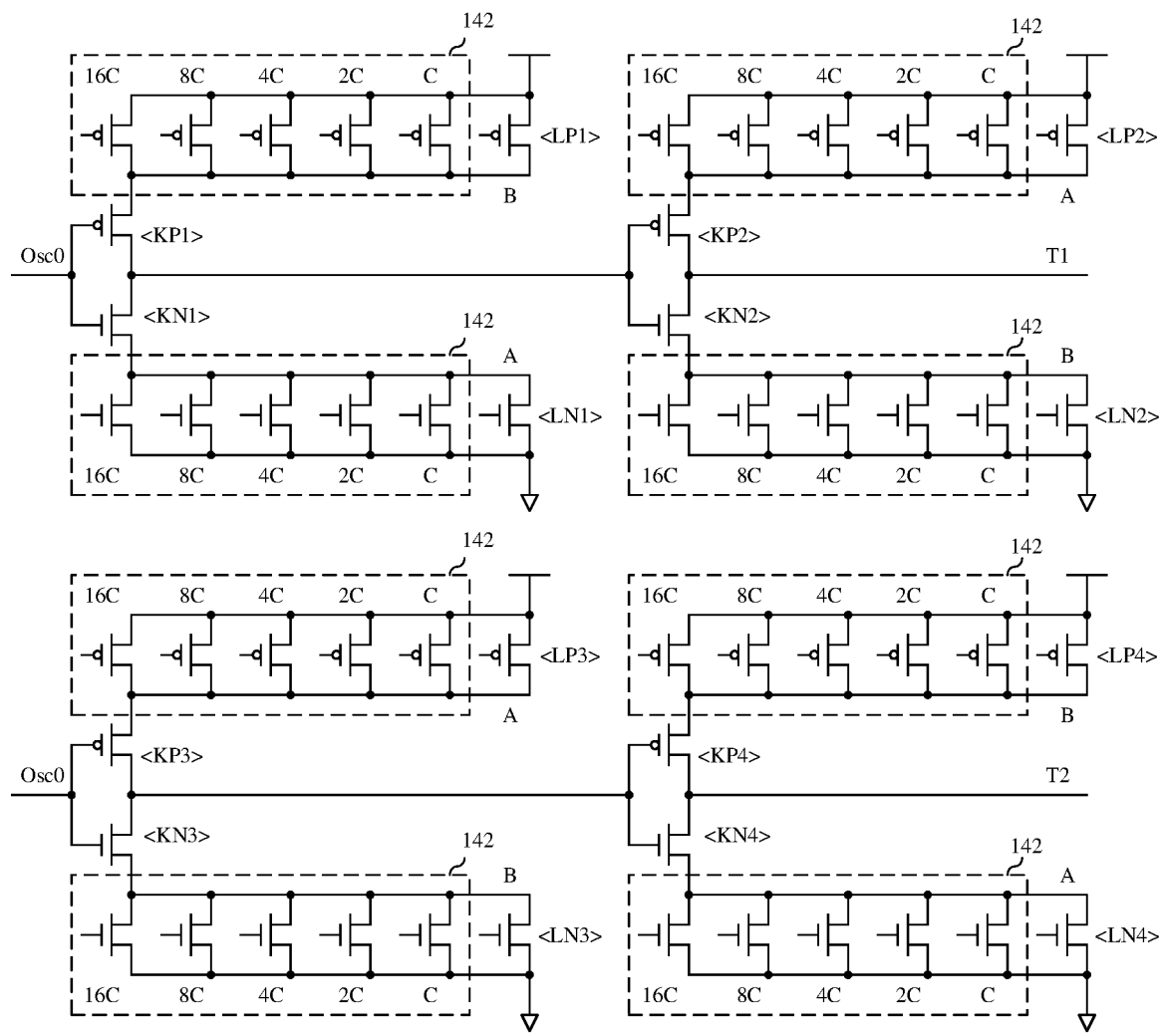
FIG. 7 is a schematic structural diagram of a first adjustment unit and a second adjustment unit according to an embodiment of the disclosure.

In a specific example, referring to FIG. 7, the first adjustment unit 112 includes a first P-type switch transistor <KP1>, a first N-type switch transistor <KN1>, a second P-type switch transistor <KP2>, and a second N-type switch transistor <KN2>. A gate electrode of the first P-type switch transistor <KP1> is connected to a gate electrode of the first N-type switch transistor <KN1>, and is configured to receive the initial oscillation signal Osc0. A source electrode of the first P-type switch transistor <KP1> is connected to a drain electrode of a first pull-up transistor <LP1>. A source electrode of the first pull-up transistor <LP1> is configured to receive a high level. A source electrode of the first N-type switch transistor <KN1> is connected to a drain electrode of a first pull-down transistor <LN1>. A source electrode of the first pull-down transistor <LN1> is configured to receive a low level. A drain electrode of the first P-type switch transistor <KP1> is connected to a drain electrode of the first N-type switch transistor <KN1>, and connects a gate electrode of the second P-type switch transistor <KP2> and a gate electrode of the second N-type switch transistor <KN2>. A source electrode of the second P-type switch transistor <KP2> is connected to a drain electrode of a second pull-up transistor <LP2>. A source electrode of the second pull-up transistor <LP2> is configured to receive a high level. A source electrode of the second N-type switch transistor <KN2> is connected to a drain electrode of a second pull-down transistor <LN2>. A source electrode of the second pull-down transistor <LN2> is configured to receive a low level. The second P-type switch transistor <KP2> is connected to a drain electrode of the second N-type switch transistor <KN2>, and is configured to output the first adjustment signal T1. The first pull-up transistor <LP1> and the first pull-down transistor <LN1> are turned on based on the duty cycle control signal Duty, and the driving capability of the first pull-down transistor <LN1> is greater than the driving capability of the first pull-up transistor <LP1>. The second pull-up transistor <LP2> and the second pull-down transistor <LN2> are turned on based on the duty cycle control signal Duty, and the driving capability of the second pull-down transistor <LN2> is less than the driving capability of the second pull-up transistor <LP2>. The second adjustment unit 122 includes a third P-type switch transistor <KP3>, a third N-type switch transistor <KN3>, a fourth P-type switch transistor <KP4>, and a fourth N-type switch transistor <KN4>. A gate electrode of the third P-type switch transistor <KP3> is connected to a gate electrode of the third N-type switch transistor <KN3>, and is configured to receive the initial oscillation signal Osc0. A source electrode of the third P-type switch transistor <KP3> is connected to a drain electrode of a third pull-up transistor <LP3>. A source electrode of the third pull-up transistor <LP3> is configured to receive a high level. A source electrode of the third N-type switch transistor <KN3> is connected to a drain electrode of a third pull-down transistor <LN3>. A source electrode of the third pull-down transistor <LN3> is configured to receive a low level. A drain electrode of the third P-type switch transistor <KP3> is connected to a drain electrode of the third N-type switch transistor <KN3>, and connects a gate electrode of the fourth P-type switch transistor <KP4> and a gate electrode of the fourth N-type switch transistor <KN4>. A source electrode of the fourth P-type switch transistor <KP4> is connected to a drain electrode of a fourth pull-up transistor <LP4>. A source electrode of the fourth pull-up transistor <LP4> is configured to receive a high level. A source electrode of the fourth N-type switch transistor <KN4> is connected to a drain electrode of a fourth pull-down transistor <LN4>. A source electrode of the fourth pull-down transistor <LN4> is configured to receive a low level. The fourth P-type switch transistor <KP4> is connected to a drain electrode of the fourth N-type switch transistor <KN4>, and is configured to output the second adjustment signal T2. The third pull-up transistor <LP3> and the third pull-down transistor <LN3> are turned on based on the duty cycle control signal Duty, and the driving capability of the third pull-down transistor <LN3> is greater than the driving capability of the third pull-up transistor <LP3>. The fourth pull-up transistor <LP4> and the fourth pull-down transistor <LN4> are turned on based on the duty cycle control signal Duty, and the driving capability of the fourth pull-down transistor <LN4> is less than the driving capability of the fourth pull-up transistor <LP4>. It needs to be noted that the first pull-up transistor <LP1>, the first pull-down transistor <LN1>, the second pull-up transistor <LP2>, the second pull-down transistor <LN2>, the third pull-up transistor <LP3>, the third pull-down transistor <LN3>, the fourth pull-up transistor <LP4>, and the fourth pull-down transistor <LN4> may be directly turned on according to the duty cycle control signal Duty or may be turned on according to a duty cycle enable signal. The duty cycle enable signal is generated based on the duty cycle control signal Duty. For the first adjustment unit 112, because the driving capability of the second pull-up transistor <LP2> is greater than the driving capability of the second pull-down transistor <LN2>, it is easy to pull up but difficult to pull down the first adjustment signal T1. Therefore, compared with the initial oscillation signal Osc0, for the first adjustment signal T1, the delay of the rising edge is small, and the delay of the rising edge is large. For the second adjustment unit 122, because the driving capability of the fourth pull-up transistor <LP4> is less than the driving capability of the fourth pull-down transistor <LN4>, it is easy to pull down but difficult to pull up the second adjustment signal T2. Therefore, compared with the initial oscillation signal Osc0, for the second adjustment signal T2, the delay of the rising edge is large, and the delay of the rising edge is small.

In some embodiments, the driving capability of the first pull-up transistor <LP1>, the driving capability of the second pull-down transistor <LN2>, the driving capability of the third pull-down transistor <LN3>, and the driving capability of the fourth pull-up transistor <LP4> are the same. The driving capability of the first pull-down transistor <LN1>, the driving capability of the second pull-up transistor <LP2>, the driving capability of the third pull-up transistor <LP3>, and the driving capability of the fourth pull-down transistor <LN4> are the same. Continuing to refer to FIG. 7, specifically, the driving capability of the first pull-up transistor <LP1>, the driving capability of the second pull-down transistor <LN2>, the driving capability of the third pull-down transistor <LN3>, and the driving capability of the fourth pull-up transistor <LP4> are B. The driving capability of the first pull-down transistor <LN1>, the driving capability of the second pull-up transistor <LP2>, the driving capability of the third pull-up transistor <LP3>, and the driving capability of the fourth pull-down transistor <LN4> are A. The driving capability represented by A is greater than the driving capability represented by B. It is set that the driving capability of the first pull-up transistor <LP1>, the driving capability of the second pull-down transistor <LN2>, the driving capability of the third pull-down transistor <LN3>, and the driving capability of the fourth pull-up transistor <LP4> are the same, it is set that the driving capability of the first pull-down transistor <LN1>, the driving capability of the second pull-up transistor <LP2>, the driving capability of the third pull-up transistor <LP3>, and the driving capability of the fourth pull-down transistor <LN4> are the same, the same transistor is used to control an adjustment capability of a rising edge by the first adjustment unit 112 to be the same as an adjustment capability of a falling edge by the second adjustment unit 122, and the same transistor is used to control an adjustment capability of a falling edge by the first adjustment unit 112 to be the same as an adjustment capability of a rising edge by the second adjustment unit 122, so that a total delay of adjustment of a rising edge and a falling edge of the first adjustment unit 112 is consistent with a total delay of a rising edge and a falling edge of the second adjustment unit 122, to ensure that the first adjustment signal T1 and the second adjustment signal T2 have the same period, making it convenient for the calibration unit 132 to adjust the duty cycles of the first adjustment signal T1 and the second adjustment signal T2.

In this embodiment, the first adjustment unit 112 and the second adjustment unit 122 further include a correction transistor group 142. The correction transistor group 142 includes x correction transistors disposed in parallel. In the x correction transistors, the driving capability of an nth correction transistor is twice the driving capability of an $(n-1)^{th}$ correction transistor, where x is an integer greater than or equal to 2, and n is any integer less than or equal to x and greater than or equal to 2. Further, the duty cycle control signal Duty is further used for selecting to turn on a correction transistor in the correction transistor group 142. In this case, the driving capability of the correction transistor group 142 is equivalent driving capability of a plurality of correction transistors that are turned on. The correction transistor group 142 is separately disposed in parallel to the first pull-up transistor <LP1>, the first pull-down transistor <LN1>, the second pull-up transistor <LP2>, the second pull-down transistor <LN2>, the third pull-up transistor <LP3>, the third pull-down transistor <LN3>, the fourth pull-up transistor <LP4>, and the fourth pull-down transistor <LN4>, and the type of a correction transistor in the correction transistor group 142 is the same as the type of a transistor connected in parallel. In a specific example, continuing to refer to FIG. 7, the correction transistor group 142 includes a first correction transistor, a second correction transistor, a third correction transistor, a fourth correction transistor, and a fifth correction transistor. The driving capability of the first correction transistor is C, the driving capability of the second correction transistor is 2 C, the driving capability of the third correction transistor is 4 C, the driving capability of the fourth correction transistor is 8 C, and the driving capability of the fifth correction transistor is 16 C. A first driving transistor, a second driving transistor, a third driving transistor, a fourth driving transistor, and a fifth driving transistor are selectively turned on based on the duty cycle control signal Duty, to control the first adjustment unit 112 and the second adjustment unit 122 to perform a signal delay to different degrees on the initial oscillation signal Osc0. It needs to be noted that the foregoing "C" represents a preset unit value, and may be correspondingly designed according to a circuit design in actual application. The foregoing description is only used for reflecting a multiple relationship of the driving capability between correction transistors. It needs to be noted that the plurality of correction transistors in the correction transistor group 142 may be disposed in parallel in this embodiment. In other embodiments, the plurality of correction transistors in the correction transistor group may be disposed in series or may be disposed in the form of a series and parallel combination.

Figure 8:
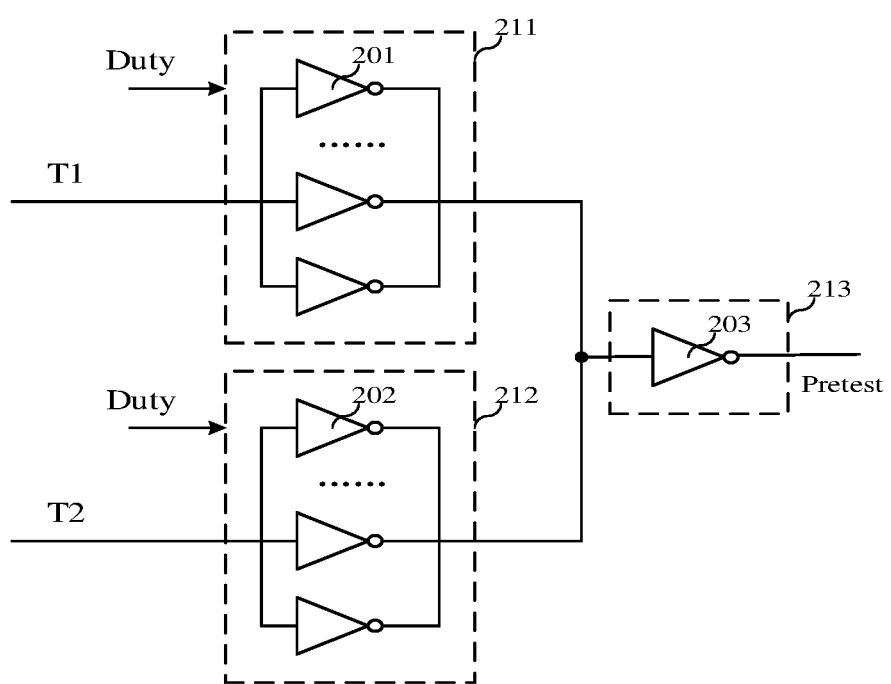
FIG. 8 is a schematic structural diagram of a calibration unit according to an embodiment of the disclosure.

For the calibration unit 132, referring to FIG. 8, the calibration unit 132 includes: a plurality of first driving subunits that are disposed in parallel to each other, each having an input terminal connected to the first adjustment unit 112 and further configured to receive the duty cycle control signal Duty; a plurality of second driving subunits that are disposed in parallel to each other, each having an input terminal connected to the second adjustment unit 122 and further configured to receive the duty cycle control signal Duty, where the duty cycle control signal Duty is used for selectively turning on the plurality of first driving subunits and the plurality of second driving subunits; and a third driving subunit 213, having an input terminal connected to an output terminal of each first driving subunit and an output terminal of each second driving subunit and an output terminal configured to output the intermediate test signal Pretest. Specifically, when the driving capability of the plurality of first driving subunits is greater than the driving capability of the plurality of second driving subunits, the duty cycle of the intermediate test signal Pretest outputted by the third driving subunit 213 is biased toward the first adjustment signal T1. That is, in the intermediate test signal Pretest generated according to the first adjustment signal T1 and the second adjustment signal T2, the proportion of the first adjustment signal T1 is larger. When the driving capability of the plurality of second driving subunits is greater than the driving capability of the plurality of first driving subunits, the duty cycle of the intermediate test signal Pretest outputted by the third driving subunit 213 is biased toward the second adjustment signal T2. That is, in the intermediate test signal Pretest generated according to the first adjustment signal T1 and the second adjustment signal T2, the proportion of the second adjustment signal T2 is larger. It may be understood that the driving capability of the plurality of first driving subunits is an equivalent driving capability of first driving subunits that are turned on in the plurality of first driving subunits. Similarly, the driving capability of the plurality of second driving subunits is an equivalent driving capability of second driving subunits that are turned on in the plurality of second driving subunits.

In this embodiment, continuing to refer to FIG. 8, the signal generator 100 includes a first inverter group 211, configured to receive the duty cycle control signal Duty, where the first inverter group 211 includes a plurality of first adjustment inverters 201 connected in parallel, each first adjustment inverter 201 is used as one first driving subunit, and the duty cycle control signal Duty is used for selectively turning on the first adjustment inverters 201 in the first inverter group 211; and a second inverter group 212, having an input terminal connected to the second adjustment unit 122 and further configured to receive the duty cycle control signal Duty, where the second inverter group 212 includes a plurality of second adjustment inverters 202 connected in parallel, each second adjustment inverter 202 is used as one second driving subunit, and the duty cycle control signal Duty is used for selectively turning on the second adjustment inverters 202 in the second inverter group 212. The third driving subunit 213 includes a third adjustment inverter 203, having an input terminal connected to an output terminal of the first inverter group 211 and an output terminal of the second inverter group 212, and an output terminal configured to output the intermediate test signal Pretest. Because the first inverter group 211 includes the plurality of first adjustment inverters 201 connected in parallel and the second inverter group 212 includes the plurality of second adjustment inverters 202 connected in parallel, when more inverters connected in parallel are turned on, the first adjustment inverters 201 or the second adjustment inverters 202 as a whole have a higher driving capability. That is, numbers of the first adjustment inverters 201 and the second adjustment inverters 202 that are turned on in the first inverter group 211 and the second inverter group 212 are controlled to adjusting the duty cycle of the intermediate test signal Pretest.

Figure 9:
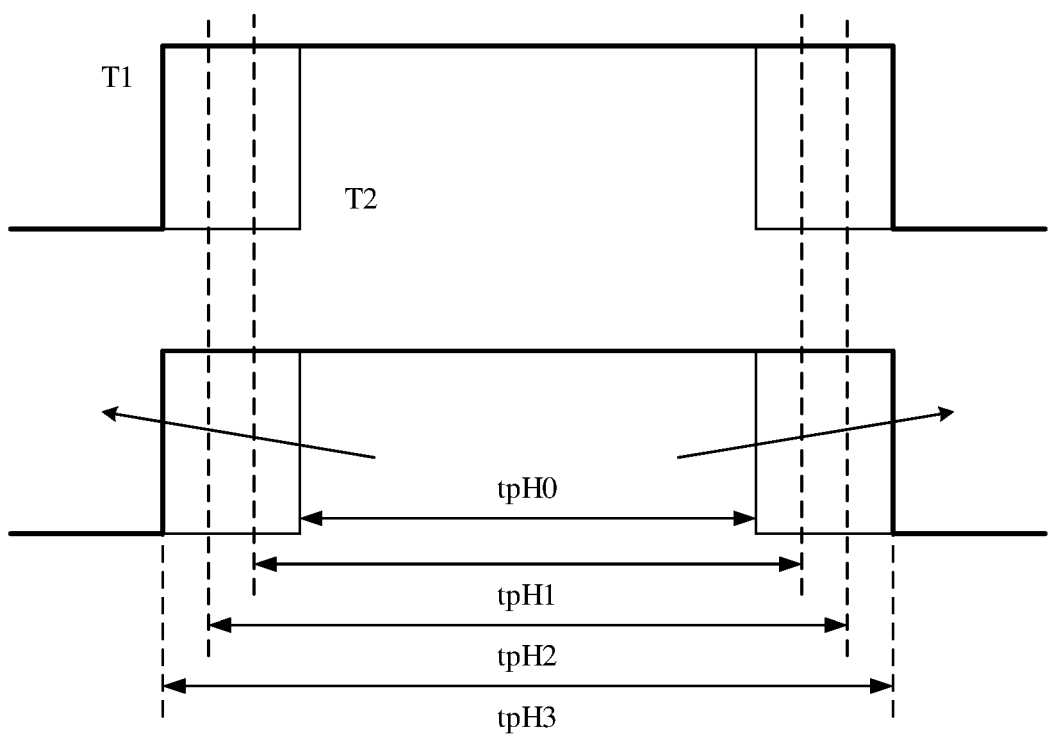
FIG. 9 is a schematic diagram of the calibration principle of a calibration unit according to an embodiment of the disclosure.

In a specific example, referring to FIG. 8 in combination with FIG. 9, it is assumed that the first inverter group 211 includes three first adjustment inverters 201 and the second inverter group 212 includes three second adjustment inverters 202. That is, the calibration unit includes three first driving subunits and three second driving subunits. In this case, the conduction of the first driving subunits and the second driving subunits may include the following cases: (1) Three first driving subunits and zero second driving subunits are turned on. In this case, the intermediate test signal Pretest and the first adjustment signal T1 have the same duty cycle, and a duration of a high-level signal is tpH3. (2) Two first driving subunits and one second driving subunits are turned on. In this case, the intermediate test signal Pretest is biased toward the first adjustment signal T1, and the duration of the high-level signal is tpH2. (3) One first driving subunit and two second driving subunits are turned on. In this case, the intermediate test signal Pretest is biased toward the second adjustment signal T2, and the duration of the high-level signal is tpH1. (4) Zero first driving subunits and three second driving subunits are turned on. In this case, the intermediate test signal Pretest and the second adjustment signal T2 have the same duty cycle, and the duration of the high-level signal is tpH0.

Figure 10:
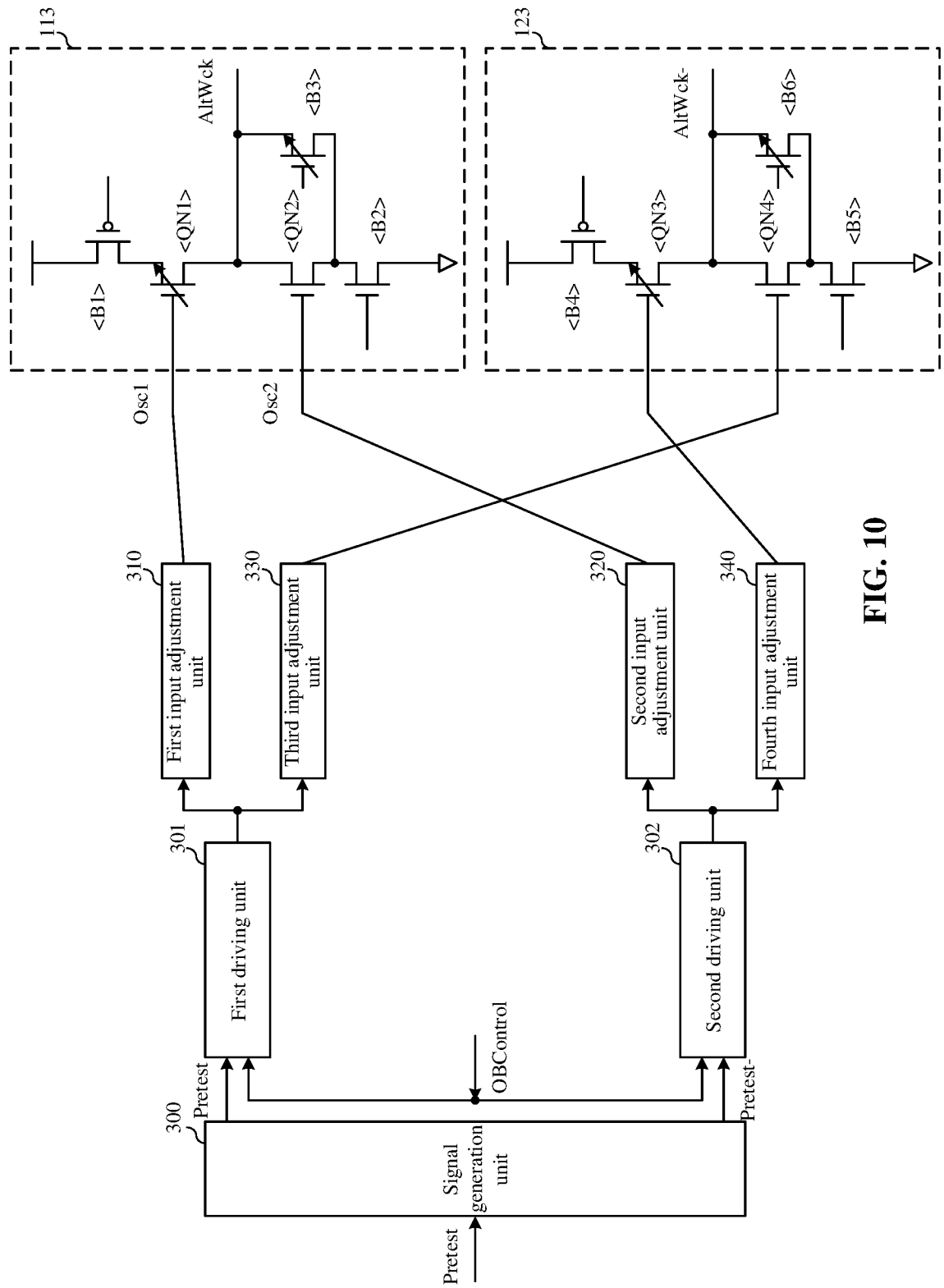
FIG. 10 is a schematic structural diagram of an amplitude adjustment circuit according to an embodiment of the disclosure.

For the amplitude adjustment circuit 103, referring to FIG. 10, the amplitude adjustment circuit 103 includes: a first signal generation unit 113, configured to pull up an output signal based on the intermediate test signal Pretest and pull down an output signal based on an inverted test signal Pretest– to generate the reference test signal AltWck with the same phase as the intermediate test signal Pretest; and a second signal generation unit 123, configured to pull up an output signal based on the inverted test signal Pretest– and pull down an output signal based on the intermediate test signal Pretest to generate an inverted reference test signal AltWck– with the same phase as the inverted test signal Pretest–. The intermediate test signal Pretest and the inverted test signal Pretest– have the same amplitude but opposite phases. Specifically, a first driving transistor <QN1> has a gate electrode configured to receive the intermediate test signal Pretest and a drain electrode configured to receive a high level. A second driving transistor <QN2> has a gate electrode configured to receive the inverted test signal Pretest– and a source electrode configured to receive a low level. A source electrode of the first driving transistor <QN1> is connected to a drain electrode of the second driving transistor <QN2> and is configured to output the reference test signal AltWck. The amplitude control signal OBControl is used for adjusting the driving capability of the first driving transistor <QN1>. It needs to be noted that in this embodiment, the amplitude control signal OBControl adjusts the driving capability of the first driving transistor <QN1> to change the driving capability of the first signal generation unit 113. In other embodiments, it may be set that the amplitude control signal adjusts the driving capability of the second driving transistor or jointly adjusts the first driving transistor and the second driving transistor to change the driving capability of the first signal generation unit. The second signal generation unit 123 includes a third driving transistor and a fourth driving transistor. A third driving transistor <QN3> has a gate electrode configured to receive the intermediate test signal Pretest and a drain electrode configured to receive a high level. A fourth driving transistor <QN4> has a gate electrode configured to receive the inverted test signal Pretest– and a source electrode configured to receive a low level. A source electrode of the third driving transistor <QN3> is connected to a drain electrode of the fourth driving transistor <QN4> and is configured to output the inverted reference test signal AltWck–. The amplitude control signal OBControl is used for adjusting the driving capability of the third driving transistor <QN3>. It needs to be noted that in this embodiment, the amplitude control signal OBControl adjusts the driving capability of the third driving transistor <QN3> to change the driving capability of the second signal generation unit 123. In other embodiments, it may be set that the amplitude control signal adjusts the driving capability of the fourth driving transistor or jointly adjusts the third driving transistor and the fourth driving transistor to change the driving capability of the second signal generation unit. In an example, the amplitude control signal OBControl may change aspect ratios or substrate voltages of the first driving transistor <QN1> and the third driving transistor <QN3> to adjust the driving capability of the first driving transistor <QN1> and the third driving transistor <QN3>. Similarly, the driving capability of the second driving transistor and the driving capability of the fourth driving transistor may be adjusted in a similar manner. Further, the first signal generation unit 113 may include a first switch transistor <B1>, a second switch transistor <B2>, and a first anti-interference transistor <B3>. The first switch transistor <B1> has a source electrode coupled to a power supply node, a drain electrode connected to a drain electrode of the first driving transistor <QN1>, and a gate electrode configured to receive the amplitude control signal OBControl, and the second switch transistor <B2> has a source electrode coupled to a ground wire node, a drain electrode connected to a drain electrode of the second driving transistor <QN2>, and a gate electrode configured to receive the amplitude control signal OBControl, so as to be turned on after the amplitude control signal OBControl is received, thereby reducing the power consumption of the first signal generation unit 113 during idle time. In addition, the first anti-interference transistor <B3> is connected in parallel to the second driving transistor <QN2> and has a gate electrode configured to receive the amplitude control signal OBControl. The amplitude control signal OBControl is further used for adjusting the driving capability of the first anti-interference transistor <B3>, to adjust the anti-interference capability of the first anti-interference transistor <B3>. Because the driving capability of the first driving transistor <QN1> may be adjusted based on the amplitude control signal OBControl, that is, when the driving capability of the first driving transistor <QN1> is large, the outputted reference test signal AltWck has a large amplitude, and a high anti-interference capability is required. When the driving capability of the first driving transistor <QN1> is small, the outputted reference test signal AltWck has a low amplitude, and a low anti-interference capability is required. Therefore, the amplitude control signal OBControl is used to correspondingly adjust the anti-interference capability of the first anti-interference transistor <B3>, to ensure the accuracy of the reference test signal AltWck generated by the first signal generation unit 113 and reduce the power consumption of the first anti-interference transistor <B3>. In this embodiment, the amplitude control signal OBControl is further used for enabling the first switch transistor <B1>, the second switch transistor <B2>, and the first anti-interference transistor <B3> and at the same time adjusting the driving capability of the first anti-interference transistor <B3>. In other embodiments, it may be set that the first switch transistor, the second switch transistor, and the first anti-interference transistor are turned on based on an amplitude enable signal. The amplitude enable signal is generated based on the amplitude control signal. The second signal generation unit 123 may include a third switch transistor <B4>, a fourth switch transistor <B5>, and a second anti-interference transistor <B6>. The third switch transistor <B4> has a source electrode coupled to a power supply node, a drain electrode connected to a drain electrode of the fourth driving transistor <QN4>, and a gate electrode configured to receive the amplitude control signal OBControl, and the fourth switch transistor <B5> has a source electrode coupled to a ground wire node, a drain electrode connected to a drain electrode of a fifth driving transistor <QN5>, and a gate electrode configured to receive the amplitude control signal OBControl, so as to be turned on after the amplitude control signal OBControl is received, thereby reducing the power consumption of the second signal generation unit 123 during idle time. In addition, the second anti-interference transistor <B6> is connected in parallel to the fifth driving transistor <QN5> and has a gate electrode configured to receive the amplitude control signal OBControl. The amplitude control signal OBControl is further used for adjusting the driving capability of the second anti-interference transistor <B6>, to adjust the anti-interference capability of the second anti-interference transistor <B6>. Because the driving capability of the third driving transistor <QN3> may be adjusted based on the amplitude control signal OBControl. That is, when the driving capability of the third driving transistor <QN3> is large, the outputted inverted reference test signal AltWck– has a large amplitude, and a high anti-interference capability is required. When the driving capability of the third driving transistor <QN3> is small, the outputted inverted reference test signal AltWck– has a low amplitude, and a low anti-interference capability is required. Therefore, the amplitude control signal OBControl is used to correspondingly adjust the anti-interference capability of the second anti-interference transistor <B6>, to ensure the accuracy of the inverted reference test signal AltWck-generated by the second signal generation unit 123 and reduce the power consumption of the second anti-interference transistor <B6>. In this embodiment, the amplitude control signal OBControl is further used for enabling the third switch transistor <B4>, the fourth switch transistor <B5>, and the second anti-interference transistor <B6> and at the same time adjusting the driving capability of the second anti-interference transistor <B6>. In other embodiments, it may be set that the third switch transistor, the fourth switch transistor, and the second anti-interference transistor are turned on based on an amplitude enable signal. The amplitude enable signal is generated based on the amplitude control signal. It needs to be noted that this embodiment is described in detail by using an example in which the first signal generation unit 113 generates the reference test signal AltWck and the second signal generation unit 123 generates the inverted reference test signal AltWck–, which does not constitute a limitation to this embodiment. In other embodiments, it may be set that the first signal generation unit generates an inverted test signal and the second signal generation unit generates a test signal.

Specifically, in this embodiment, the amplitude adjustment circuit 103 further includes a signal generation unit 300, connected to the amplitude adjustment circuit 103 and the duty cycle correction circuit 102, and configured to generate the inverted test signal Pretest-based on the intermediate test signal Pretest. In a specific example, the first signal generation unit 113 includes the first driving transistor <QN1> and the second driving transistor <QN2>.

In this embodiment, the amplitude control signal OBControl is further used for controlling the input of the intermediate test signal Pretest and the inverted test signal Pretest–. In a specific example, the signal generator 100 further includes a first driving unit 301 and a second driving unit 302. The first driving unit 301 is configured to receive the amplitude control signal OBControl and the intermediate test signal Pretest. The first driving unit 301 is configured to: if the amplitude control signal OBControl and the intermediate test signal Pretest are simultaneously received, output one of the intermediate test signal Pretest and the inverted test signal Pretest–. The second driving unit 302 is configured to receive the amplitude control signal OBControl and the inverted test signal Pretest–. The second driving unit 302 is configured to: if the amplitude control signal OBControl and the inverted test signal Pretest– are simultaneously received, output the other of the intermediate test signal Pretest and the inverted test signal Pretest–. Specifically, if the first driving unit 301 is designed based on a NAND gate, in this case, if the amplitude control signal OBControl and the intermediate test signal Pretest are simultaneously received, the inverted test signal Pretest– is outputted. If the first driving unit 301 is designed based on an AND gate, in this case, if the amplitude control signal OBControl and the intermediate test signal Pretest are simultaneously received, the intermediate test signal Pretest is outputted. If the second driving unit 302 is designed based on a NAND gate, in this case, if the amplitude control signal OBControl and the inverted test signal Pretest– are simultaneously received, the intermediate test signal Pretest is outputted. If the second driving unit 302 is designed based on an AND gate, in this case, if the amplitude control signal OBControl and the inverted test signal Pretest– are simultaneously received, the inverted test signal Pretest– is outputted. It needs to be noted that in this embodiment, the amplitude control signal OBControl is further used for enabling the first driving unit 301 and the second driving unit 302. In other embodiments, it may be set that the first driving unit and the second driving unit are turned on based on an amplitude enable signal. The amplitude enable signal is generated based on the amplitude control signal. Continuing to refer to FIG. 10, because the first driving unit 301 and the second driving unit 302 have relatively large device distances from the first signal generation unit 113 and the second signal generation unit 123, the outputted intermediate test signal Pretest and inverted test signal Pretest– may encounter a signal attenuation phenomenon. To avoid this phenomenon, in some embodiments, the amplitude adjustment circuit 103 further includes a first input adjustment unit 310, a second input adjustment unit 320, a third input adjustment unit 330, and a fourth input adjustment unit 340. The first input adjustment unit 310 is connected to the first signal generation unit 113, and is configured to perform driving to provide the intermediate test signal Pretest to the first signal generation unit 113. The second input adjustment unit 320 is connected to the second signal generation unit 123, and is configured to perform driving to provide the intermediate test signal Pretest to the second signal generation unit 123. The third input adjustment unit 330 is connected to the first signal generation unit 113, and is configured to perform driving to provide the inverted test signal Pretest– to the first signal generation unit 113. The fourth input adjustment unit 340 is connected to the second signal generation unit 123, and is configured to perform driving to provide the inverted test signal Pretest– to the second signal generation unit 123. In an example, each of the first input adjustment unit 310, the second input adjustment unit 320, the third input adjustment unit 330, and the fourth input adjustment unit 340 includes an even-numbered quantity of inverters. In another example, each of the first input adjustment unit 310, the second input adjustment unit 320, the third input adjustment unit 330, and the fourth input adjustment unit 340 includes an odd-numbered quantity of inverters. In this case, the first input adjustment unit 310 is configured to provide the inverted test signal Pretest– to the first signal generation unit 113. The second input adjustment unit 320 is configured to provide the inverted test signal Pretest– to the second signal generation unit 123. The third input adjustment unit 330 is configured to provide the intermediate test signal Pretest to the first signal generation unit 113. The fourth input adjustment unit 340 is configured to provide the intermediate test signal Pretest to the second signal generation unit 123.

Figure 11:
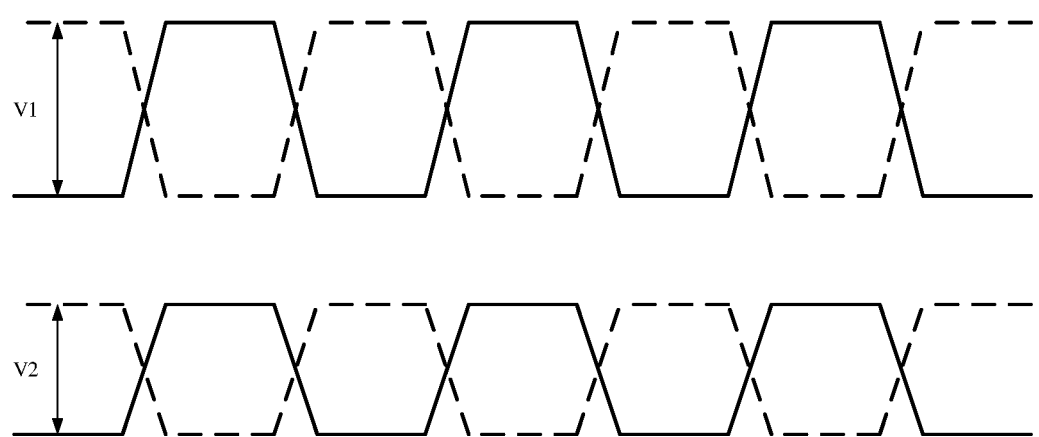
FIG. 11 is a schematic diagram of the adjustment principle of an amplitude adjustment circuit according to an embodiment of the disclosure.

Referring to FIG. 11, the reference test signal AltWck and the inverted reference test signal AltWck-generated after the intermediate test signal Pretest and the inverted test signal Pretest-pass through the amplitude adjustment circuit 103 have the same phase and amplitude changing from V1 to V2, to meet subsequent use requirements.

Figure 12:
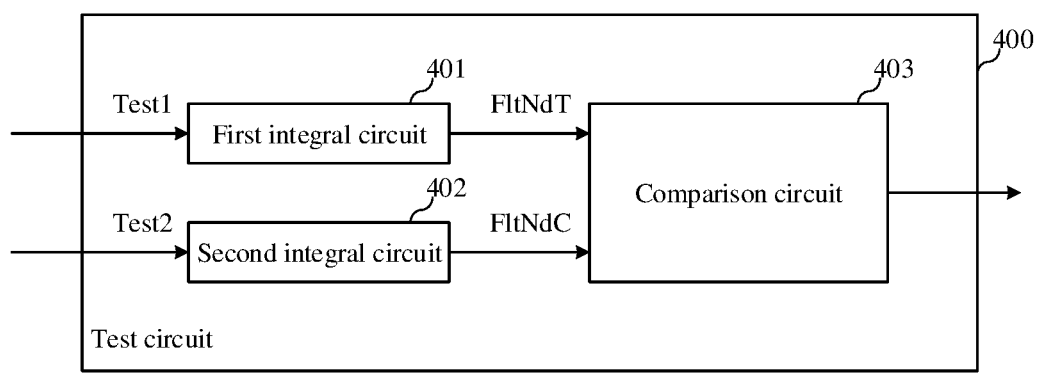
FIG. 12 is a schematic structural diagram of a test circuit according to an embodiment of the disclosure.

For the test circuit 400, referring to FIG. 12, a first integral circuit 401 is configured to receive a first test signal Test1, and is configured to integrate the first test signal Test1 to output a first integral signal FltNdT. A second integral circuit 402 is configured to receive a second test signal Test2, and is configured to integrate the second test signal Test2 to output a second integral signal FltNdC. The first test signal Test1 is a to-be-tested signal inputted into the test circuit 400. The first test signal Test1 and the second test signal Test2 are inverted signals of each other. A voltage value of the first integral signal FltNdT is a product of multiplying a duty cycle of the first test signal Test1 by a power supply amplitude. A voltage value of the second integral signal FltNdC is a product of multiplying a duty cycle of the second test signal Test2 by the power supply amplitude. A comparison circuit 403 has an input terminal connected to the first integral circuit 401 and another input terminal connected to the second integral circuit 402. The comparison circuit 403 is configured to compare the first integral signal FltNdT with the second integral signal FltNdC, output a high-level signal when the first integral signal FltNdT is greater than the second integral signal FltNdC, and output a low-level signal when the second integral signal FltNdC is greater than the first integral signal FltNdT.

Figure 13:
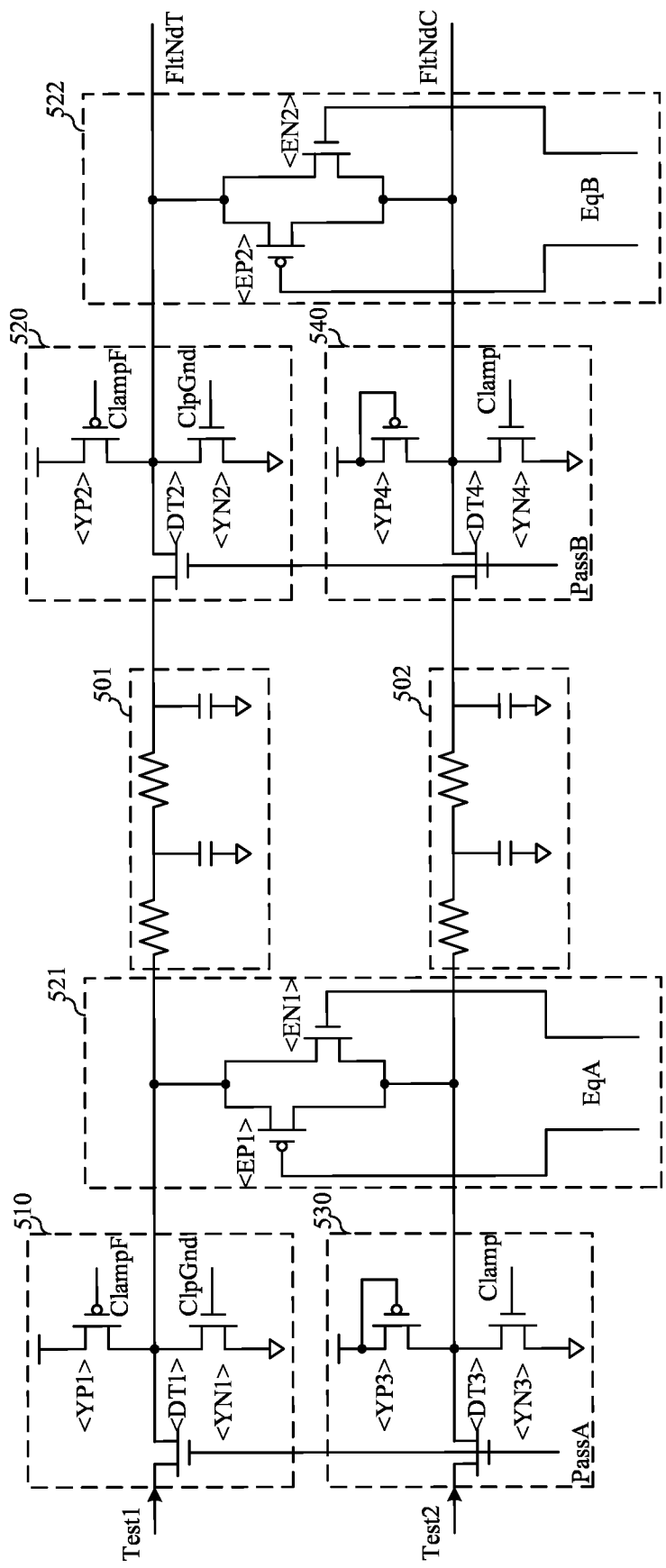
FIG. 13 is a schematic structural diagram of a first integral circuit and a second integral circuit according to an embodiment of the disclosure.

Specifically, in this embodiment, referring to FIG. 13, the first integral circuit 401 includes a first filter unit 501, a first preprocessing unit 510, and a second preprocessing unit 520. The first filter unit 501 is configured to integrate a received signal. That is, the first filter unit 501 is configured to integrate the first test signal Test1. The first preprocessing unit 510 includes a first conducting transistor <DT1>, a first P-type precharge transistor <YP1>, and a first N-type precharge transistor <YN1>. The first conducting transistor <DT1> has a drain electrode configured to receive the first test signal Test1, a source electrode connected to an input terminal of the first filter unit 501, and a gate electrode configured to receive a first switch signal PassA. The first P-type precharge transistor <YP1> has a source electrode configured to receive a high level, a drain electrode connected to the input terminal of the first filter unit 501, and a gate electrode configured to receive an integral charge signal ClampF. The first N-type precharge transistor <YN1> has a source electrode configured to receive a low level, a drain electrode connected to the input terminal of the first filter unit 501, and a gate electrode configured to receive a first integral discharge signal ClpGnd. Specifically, the first switch signal PassA is used for starting the first preprocessing unit 510. When the first switch signal PassA turns on the first conducting transistor <DT1>, the first filter unit 501 receives the first test signal Test1 and starts to integrate the first test signal Test1. The first P-type precharge transistor <YP1> is turned on based on the integral charge signal ClampF, to indirectly connect the input terminal of the first filter unit 501 to a high level, so as to pull up a potential at the input terminal of the first filter unit 501. The first N-type precharge transistor <YN1> is turned on based on the first integral discharge signal ClpGnd, to indirectly connect the input terminal of the first filter unit 501 to a low level, so as to pull down the potential at the input terminal of the first filter unit 501. The second preprocessing unit 520 includes a second conducting transistor <DT2>, a second P-type precharge transistor <YP2>, and a second N-type precharge transistor <YN2>. The second conducting transistor <DT2> has a drain electrode connected to an output terminal of the first filter unit 501, a source electrode configured to output the first integral signal FltNdT, and a gate electrode configured to receive a second switch signal PassB. The second P-type precharge transistor <YP2> has a source electrode configured to receive a high level, a drain electrode connected to the output terminal of the first filter unit 501, and a gate electrode configured to receive the integral charge signal ClampF. The second N-type precharge transistor <YN2> has a source electrode configured to receive a low level, a drain electrode connected to the input terminal of the first filter unit 501, and a gate electrode configured to receive the first integral discharge signal ClpGnd. Specifically, the second switch signal PassB is configured to start the second preprocessing unit 520. When the second switch signal PassB turns on the second conducting transistor <DT2>, the first integral signal FltNdT obtained through integration by the first filter unit 501 may be outputted to the comparison circuit 403. The second P-type precharge transistor <YP2> is turned on based on the integral charge signal ClampF, to indirectly connect the output terminal of the first filter unit 501 to a high level, so as to pull up a potential at the output terminal of the first filter unit 501. The second N-type precharge transistor <YN2> is turned on based on the first integral discharge signal ClpGnd, to indirectly connect the output terminal of the first filter unit 501 to a low level, so as to pull down the potential at the output terminal of the first filter unit 501. The second integral circuit 402 includes a second filter unit 502, a third preprocessing unit 530, and a fourth preprocessing unit 540. The second filter unit 502 is configured to integrate a received signal. That is, the second filter unit 502 is configured to integrate the second test signal Test2. The third preprocessing unit 530 includes a third conducting transistor <DT3>, a third P-type precharge transistor <YP3>, and a third N-type precharge transistor <YN3>. The third conducting transistor <DT3> has a drain electrode configured to receive the second test signal Test2, a source electrode connected to an input terminal of the second filter unit 502, and a gate electrode configured to receive the first switch signal PassA. The third P-type precharge transistor <YP3> has a source electrode connected to a gate electrode and configured to receive a high level and a drain electrode connected to the input terminal of the second filter unit 502. The third N-type precharge transistor <YN3> has a source electrode configured to receive a low level, a drain electrode connected to the input terminal of the second filter unit 502, and a gate electrode configured to receive a second integral discharge signal Clamp. Specifically, the first switch signal PassA is used for starting the third preprocessing unit 530. When the first switch signal PassA turns on the third conducting transistor <DT3>, the second filter unit 502 receives the second test signal Test2 and starts to integrate the second test signal Test2. The source electrode and the gate electrode of the third P-type precharge transistor <YP3> simultaneously receive a high level, to enable the third P-type precharge transistor <YP3> to be in a cut-off state, to prevent the high level from pulling up a potential at the input terminal of the second filter unit 502. The third N-type precharge transistor <YN3> is turned on based on the second integral discharge signal Clamp, to indirectly connect the input terminal of the second filter unit 502 to a low level, so as to pull down the potential at the output terminal of the second filter unit 502. The fourth preprocessing unit 540 includes a fourth conducting transistor <DT3>, a fourth P-type precharge transistor <YP4>, and a fourth N-type precharge transistor <YN4>. The fourth conducting transistor <DT3> has a drain electrode connected to an output terminal of the second filter unit 502, a source electrode configured to output the second integral signal FltNdC, and a gate electrode configured to receive the second switch signal PassB. The fourth P-type precharge transistor <YP4> has a source electrode connected to a gate electrode and configured to receive a high level and a drain electrode connected to the output terminal of the second filter unit 502. The fourth N-type precharge transistor <YN4> has a source electrode configured to receive a low level, a drain electrode connected to the output terminal of the second filter unit 502, and a gate electrode configured to receive the second integral discharge signal Clamp. Specifically, the second switch signal PassB is configured to start the fourth preprocessing unit 540. When the second switch signal PassB turns on the fourth conducting transistor <DT3>, the second integral signal FltNdC obtained through integration by the second filter unit 502 may be outputted to the comparison circuit 403. The source electrode and the gate electrode of the fourth P-type precharge transistor <YP4> simultaneously receive a high level, to enable the fourth P-type precharge transistor <YP4> to be in a cut-off state, to prevent the high level from pulling up a potential at the output terminal of the second filter unit 502. The fourth N-type precharge transistor <YN4> is turned on based on the second integral discharge signal Clamp, to indirectly connect the output terminal of the second filter unit 502 to a low level, so as to pull down the potential at the output terminal of the second filter unit 502.

In this embodiment, the first filter unit 501 adopts a second-order RC filter arrangement. Correspondingly, the second filter unit 502 also adopts a second-order RC filter arrangement. It needs to be noted that, in other embodiments, the first filter unit and the second filter unit may both use a first-order or a higher-order RC filter arrangement. Correspondingly, in some embodiments, different orders may be set for RC filters of the first filter unit and the second filter unit.

Continuing to refer to FIG. 13, in this embodiment, the test circuit 400 further includes a first equalizer circuit 521 and a second equalizer circuit 522. The first equalizer circuit 521 has one end connected to an input terminal of the first integral circuit 401 and the other end connected to an input terminal of the second integral circuit 402. The first equalizer circuit 521 is configured to make voltages at the input terminals of the first integral circuit 401 and the second integral circuit 402 equal based on a first equalization signal EqA. The second equalizer circuit 522 has one end connected to an output terminal of the first integral circuit 401 and the other end connected to an output terminal of the second integral circuit 402. The second equalizer circuit 522 is configured to make initial voltages of the first integral signal FltNdT and the second integral signal FltNdC equal based on a second equalization signal EqB. Specifically, in this embodiment, the first equalizer circuit 521 includes a first P-type equalization transistor <EP1> and a first N-type equalization transistor <EN1>. A source electrode of the first P-type equalization transistor <EP1> and a drain electrode of the first N-type equalization transistor <EN1> are coupled to the input terminal of the first integral circuit 401. A drain electrode of the first P-type equalization transistor <EP1> and a source electrode of the first N-type equalization transistor <EN1> are coupled to the input terminal of the second integral circuit 402. A gate electrode of the first P-type equalization transistor <EP1> is connected to a gate electrode of the first N-type equalization transistor <EN1> are configured to receive the first equalization signal EqA. The second equalizer circuit 522 includes a second P-type equalization transistor <EP2> and a second N-type equalization transistor <EN2>. A source electrode of the second P-type equalization transistor <EP2> and a drain electrode of the second N-type equalization transistor <EN2> are coupled to the output terminal of the first integral circuit 401. A drain electrode of the second P-type equalization transistor <EP2> and a source electrode of the second N-type equalization transistor <EN2> are coupled to the output terminal of the second integral circuit 402. A gate electrode of the second P-type equalization transistor <EP2> is connected to a gate electrode of the second N-type equalization transistor <EN2> are configured to receive the second equalization signal EqB. The first equalizer circuit 521 has one end connected to an input terminal of the first filter unit 501 and the other end connected to an input terminal of the second filter unit 502. The first equalizer circuit 521 is configured to make voltages at the input terminals of the first filter unit 501 and the second filter unit 502 equal based on the first equalization signal EqA. The second equalizer circuit 522 has one end connected to a drain electrode of the second conducting transistor <DT2> and the other end connected to a drain electrode of a fourth conducting transistor <DT4>. The second equalizer circuit 522 is configured to make initial voltages of the first integral signal FltNdT and the second integral signal FltNdC equal based on the second equalization signal EqB. It needs to be noted that for the first equalizer circuit 521 and the second equalizer circuit 522, equalization transistors that need to be turned on may be disposed according to actual requirements after the test circuit is equalized. For example, if the input terminals of the first filter unit 501 and the second filter unit 502 need to be equalized by the first equalizer circuit 521 to reach an intermediate level, the first P-type equalization transistor <EP1> is used to equalize potentials at the input terminals of the first filter unit 501 and the second filter unit 502. If the input terminals of the first filter unit 501 and the second filter unit 502 need to be equalized by the first equalizer circuit 521 to reach a low level, the first N-type equalization transistor <EN1> is used to equalize potentials at the input terminals of the first filter unit 501 and the second filter unit 502. If the initial voltages of the first integral signal FltNdT and the second integral signal FltNdC need to be equalized by the second equalizer circuit 522 to reach an intermediate level, the second P-type equalization transistor <EP2> is used to equalize the initial voltages of the first integral signal FltNdT and the second integral signal FltNdC. If the initial voltages of the first integral signal FltNdT and the second integral signal FltNdC need to be equalized by the second equalizer circuit 522 to reach a low level, the second N-type equalization transistor <EN2> is used to equalize the initial voltages of the first integral signal FltNdT and the second integral signal FltNdC. Input terminal voltages and output terminal voltages of the first integral circuit 401 and the second integral circuit 402 are equalized before the first integral circuit 401 and the second integral circuit 402 are integrated, to ensure the accuracy of a difference between integral values of the first integral circuit 401 and the second integral circuit 402, thereby further ensuring the accuracy of obtaining the duty cycle of a signal subsequently. In addition, in a subsequent process of outputting the first integral signal FltNdT and the second integral signal FltNdC, the first equalizer circuit 521 and the second equalizer circuit 522 are turned on, so that the power consumption of the test circuit can be further reduced.

Figure 14:
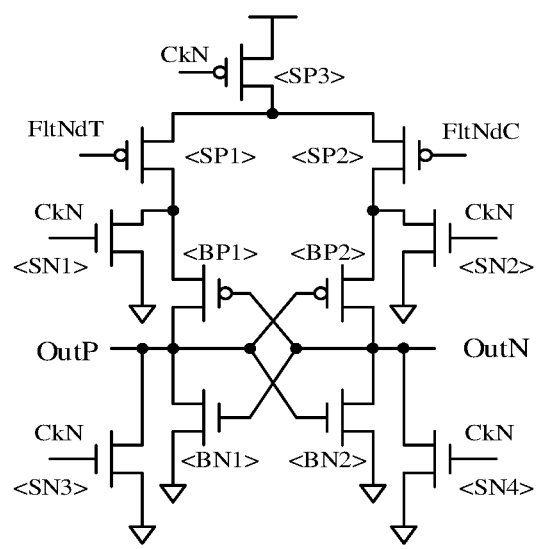
FIG. 14 is a schematic structural diagram of a comparison circuit according to an embodiment of the disclosure.

For the comparison circuit 403, referring to FIG. 14, in this embodiment, the comparison circuit 403 includes: a first P-type input transistor <SP1>, having a gate electrode configured to receive the first integral signal FltNdT, a source electrode connected to a drain electrode of a third P-type input transistor <SP3>, and a drain electrode connected to a source electrode of a first P-type comparison transistor <BP1>; a second P-type input transistor <SP2>, having a gate electrode configured to receive the second integral signal FltNdC, a source electrode connected to a drain electrode of the third P-type input transistor <SP3>, and a drain electrode connected to a source electrode of a second P-type comparison transistor <BP2>, where a gate electrode of the third P-type input transistor <SP3> is configured to receive a comparison enable signal CkN and a source electrode configured to receive a high-level signal, that is, the third P-type input transistor <SP3> is used as a high-level protection transistor of the comparison circuit 403, and the comparison enable signal CkN is used to provide a high level required for the operation of the comparison circuit 403; a first N-type input transistor <SN1>, having a gate electrode configured to receive the comparison enable signal CkN, a source electrode configured to receive a low-level signal, and a drain electrode connected to a source electrode of the first P-type comparison transistor <BP1>; a second N-type input transistor <SN2>, having a gate electrode configured to receive the comparison enable signal CkN, a source electrode configured to receive a low-level signal, and a drain electrode connected to a source electrode of the second P-type comparison transistor <BP2>; a third N-type input transistor <SN3>, having a gate electrode configured to receive the comparison enable signal CkN, a source electrode configured to receive a low-level signal, and a drain electrode connected to a drain electrode of a first N-type comparison transistor <BN1>; a fourth N-type input transistor <SN4>, having a gate electrode configured to receive the comparison enable signal CkN, a source electrode configured to receive a low-level signal, and a drain electrode connected to a drain electrode of a second N-type comparison transistor <BN2>, the first P-type comparison transistor <BP1> has a drain electrode connected to the drain electrode of the first N-type comparison transistor <BN1> and a gate electrode connected to the drain electrode of the second N-type comparison transistor <BN2>, the second P-type comparison transistor <BP2> has a drain electrode connected to the drain electrode of the second N-type comparison transistor <BN2> and a gate electrode connected to the drain electrode of the first N-type comparison transistor <BN1>, the first N-type comparison transistor <BN1> has a source electrode configured to receive a low-level signal, the drain electrode configured to output a first comparison output signal OutP, and a gate electrode connected to the drain electrode of the second N-type comparison transistor <BN2>, and the second N-type comparison transistor <BN2> has a source electrode configured to receive a low-level signal, the drain electrode configured to output a second comparison output signal OutN, and a gate electrode connected to the drain electrode of the first N-type comparison transistor. One of the first comparison output signal OutP and the second comparison output signal OutN is used as an output signal of the comparison circuit 403, and the other is used as an inverted signal of the output signal. The gate electrode of the first P-type input transistor <SP1> is configured to receive the first integral signal FltNdT. The gate electrode of the second P-type input transistor <SP2> is configured to receive the second integral signal FltNdC. In this case, after comparing and amplifying the first integral signal FltNdT and the second integral signal FltNdC, the comparison circuit 403 generates the first comparison output signal OutP and the second comparison output signal OutN. One of the first comparison output signal OutP and the second comparison output signal OutN is used for representing a comparison result between the first integral signal FltNdT and the second integral signal FltNdC, and the other is used as an inverted signal of the signal representing the comparison result. It needs to be noted that this embodiment is described in detail by using an example in which the first comparison output signal OutP is used for representing the comparison result between the first integral signal FltNdT and the second integral signal FltNdC and the second comparison output signal OutN is used as an inverted signal of the first comparison output signal OutP, which does not constitute a limitation to this embodiment. In other embodiments, the second comparison output signal may be used for representing the comparison result between the first integral signal and the second integral signal. More specifically, for the first integral signal FltNdT and the second integral signal FltNdC, if an integral value is greater than ½*power supply amplitude, the correspondingly generated first comparison output signal OutP is at a high level. If the integral value is less than or equal to ½*power supply amplitude, the correspondingly generated first comparison output signal OutP is at a low level.

Figure 15:
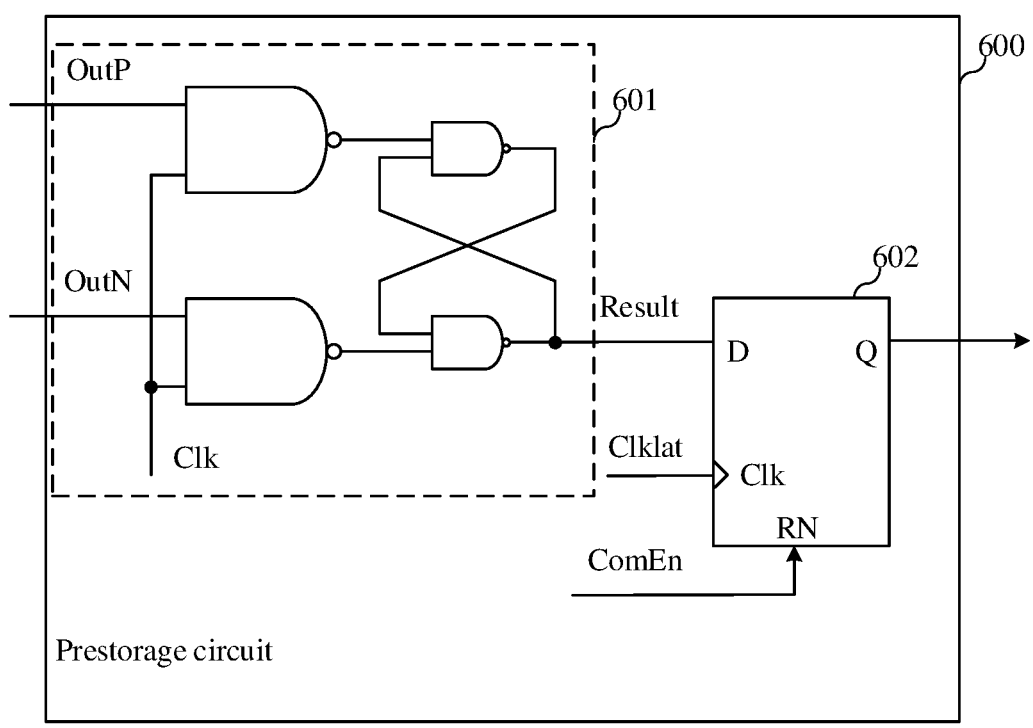
FIG. 15 is a schematic structural diagram of a prestorage circuit according to an embodiment of the disclosure.

In this embodiment, referring to FIG. 15, the test circuit 400 further includes: a prestorage circuit 600, connected to an output terminal of the comparison circuit 403, and receiving a first clock signal Clk and a second clock signal Clklat. The prestorage circuit 600 is configured to prestore, based on the first clock signal Clk, a level signal outputted by the comparison circuit 403 or output a prestored level signal based on the second clock signal Clklat. The prestorage circuit 600 is adopted to ensure that the signal output timing of the test circuit 400 is kept consistent with the signal output timing of a memory belonging to the test circuit 400, thereby ensuring that the test circuit 400 is applicable to memories of different types. The prestorage circuit 600 includes: a latch 601, having one end connected to an output terminal of the comparison circuit 403 and the other end configured to receive the first clock signal Clk, the latch 601 being configured to: when the first clock signal Clk is a valid signal, generate an indication signal Result based on the outputted level of the comparison circuit; and a register 602, having an input terminal D connected to an output terminal of the latch 601, a clock terminal C configured to receive the second clock signal Clklat, and an enable terminal RN configured to receive an output enable signal ComEn, the register 602 being configured to: when the second clock signal Clklat and the output enable signal ComEn are valid signals, output the indication signal Result. Specifically, the latch 601 includes: a first latch NAND gate, having an input terminal configured to receive the first comparison output signal OutP and another input terminal configured to receive the first clock signal Clk; a second latch NAND gate, having an input terminal configured to receive the second comparison output signal OutN and another input terminal configured to receive the first clock signal Clk; a third latch NAND gate, having an input terminal connected to an output terminal of the first latch NAND gate and another input terminal according to an output terminal of a fourth latch NAND gate; and the fourth latch NAND gate, having an input terminal connected to an output terminal of the second latch NAND gate, another input terminal connected to an output terminal of the third latch NAND gate, and an output terminal configured to output the indication signal Result. It needs to be noted that in some embodiments, the register 602 may use an FF register arrangement.

Figure 16:
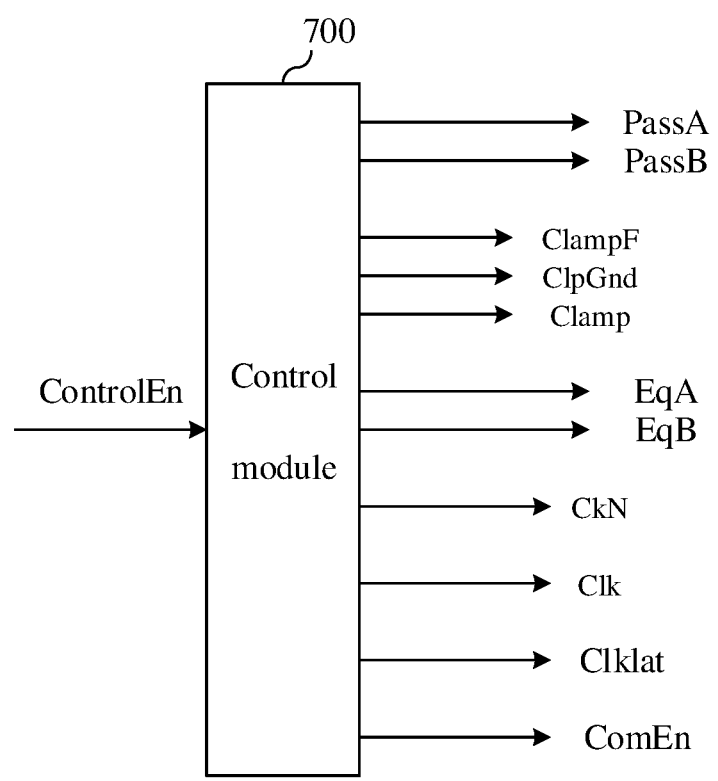
FIG. 16 is a schematic diagram of the control logic of a control circuit according to an embodiment of the disclosure.

In this embodiment, referring to FIG. 16, the test circuit 400 further includes a control circuit 700. The control circuit 700 is configured to provide, based on a control enable signal ControlEn, control signals required for duty cycle detections in the first integral circuit 401, the second integral circuit 402, and the comparison circuit 403. Specifically, the control signals required for the duty cycle detections in the first integral circuit 401, the second integral circuit 402, and the comparison circuit 403 include: the first equalization signal EqA, the second equalization signal EqB, the integral charge signal ClampF, the first integral discharge signal ClpGnd, the second integral discharge signal Clamp, the first switch signal PassA, the second switch signal PassB, the comparison enable signal CkN, the first clock signal Clk, the second clock signal Clklat, and the output enable signal ComEn.

Figure 17:
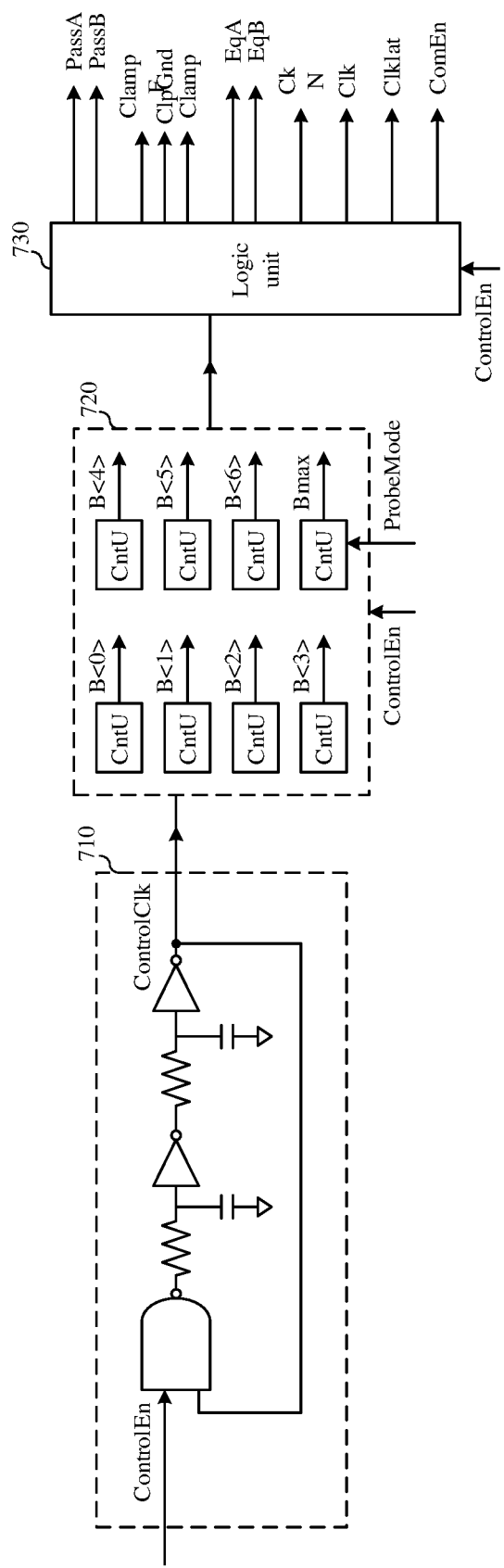
FIG. 17 is a schematic structural diagram of a control circuit according to an embodiment of the disclosure.

More specifically, referring to FIG. 17, the control circuit 700 includes: a clock unit 710, configured to generate a control clock signal ControlClk based on the control enable signal ControlEn; a timing unit 720, connected to an output terminal of the clock unit 710, and storing a signal count value B, the timing unit 720 being configured to control the signal count value B to increase by 1 when the control enable signal ControlEn and the control clock signal ControlClk are valid signals; and a logic unit 730, connected to an output terminal of the timing unit 720, storing a control signal corresponding to the signal count value B, and configured to provide the control signal corresponding to the signal count value B based on the signal count value B.

Specifically, the clock unit 710 uses a ring oscillator arrangement, and the control enable signal ControlEn is used as an enable signal for a ring oscillator. An example in which the signal count value B is a 7-bit signal formed by 7 bits is used for description, which does not constitute a limitation to this embodiment. In an actual configuration, a quantity of bits of the signal count value may be configured according to an actual requirement. In some embodiments, the timing unit 720 is further configured to receive a test control signal ProbeMode, and when the test control signal ProbeMode is valid, add a new data bit Bmax of at least one bit to the signal count value B. The new data bit Bmax increases bits of the signal count value B to increase a change period of the control clock signal ControlClk, so as to control a memory in a test mode more accurately.

Continuing to refer to FIG. 1, for the signal detection system 1000, the test control signal DcmCtrl is set to at least three bits to form a plurality of signal values. The memory further includes a logic control signal circuit 1006, configured to recognize the test control signal DcmCtrl and generate a turn-on signal PathEns corresponding to the test control signal DcmCtrl based on the test control signal DemCtrl, the turn-on signal PathEns is used for selecting to turn on a corresponding portion under test to form a different test path, and the different test path outputs a to-be-tested signal to the test circuit 400 or an external test system 10.

Specifically, one value in the test control signal DemCtrl is configured to select the test circuit 400 to perform the duty cycle test on the reference test signal AltWck. In this case, the turn-on signal PathEns is used for making a data transmission path between the signal generator 100 and the test circuit 400, to use the reference test signal AltWck with a known duty cycle to test whether the test function of the test circuit 400 is normal.

One value in the test control signal DemCtrl is configured to control the signal conversion circuit 1002 to receive the reference test signal AltWck and perform, based on the test circuit, the duty cycle test on the internal clock signal PWCK outputted by the signal conversion circuit 1002. In this case, the turn-on signal PathEns is used for making a data transmission path between the signal generator 100 and the signal conversion circuit 1002 and a data transmission path between the signal conversion circuit 1002 and the test circuit 400, to use the test circuit 400 to test whether the function of the signal conversion circuit 1002 is normal.

One value in the test control signal DcmCtrl is configured to select to perform, based on the test circuit 400, the duty cycle test on the serial read clock Clk_R2 outputted by the read clock path 1004. In this case, the turn-on signal PathEns is used for making a data transmission path between the signal generator 100 and the signal conversion circuit 1002, a data transmission path between the signal conversion circuit 1002 and the read clock path 1004, and a data transmission path between the read clock path 1004 and the test circuit 400, to use the test circuit 400 to test whether the function of the read clock path 1004 is normal.

One value in the test control signal DcmCtrl is configured to select to perform, based on the test circuit 400, the duty cycle test on the first indication signal Pup and the second indication signal Pdn outputted by the write clock path 1003. In this case, the turn-on signal PathEns is used for making a data transmission path between the signal generator 100 and the signal conversion circuit 1002, a data transmission path between the signal conversion circuit 1002 and the write clock path 1003, and a data transmission path between the write clock path 1003 and the test circuit 400, to repeatedly perform tests and adjustments to generate an equidistant parallel write clock Clk_W.

In some embodiments, the memory further includes: a clock driver 1005, having an input terminal connected to an output terminal of the signal conversion circuit 1002 and an output terminal connected to the test circuit 400 and configured to drive the internal clock signal PWCK outputted by the signal conversion circuit 1002, to avoid great signal attenuation in a transmission process of transmitting the internal clock signal PWCK to the test circuit 400 for testing, thereby ensuring the accuracy of a test result of the test circuit 400.

In some embodiments, the memory further includes: a first output component 1100, connected to the output terminal of the duty cycle correction circuit 102 (referring to FIG. 2), and configured to output the intermediate test signal Pretest to the external test system 10, the external test system 10 being configured to test whether the intermediate test signal Pretest satisfies the preset duty cycle. That is, the first output component 1100 is configured to obtain the intermediate test signal Pretest satisfying the preset duty cycle. It needs to be noted that in some embodiments, in a process of outputting the intermediate test signal Pretest to the external test system, the external test system is further configured to perform frequency division on the intermediate test signal Pretest, to make it convenient for the external test system 10 to detect the frequency of the intermediate test signal Pretest, thereby reducing a detection accuracy requirement of the external test system 10 for a signal frequency.

Figure 18:
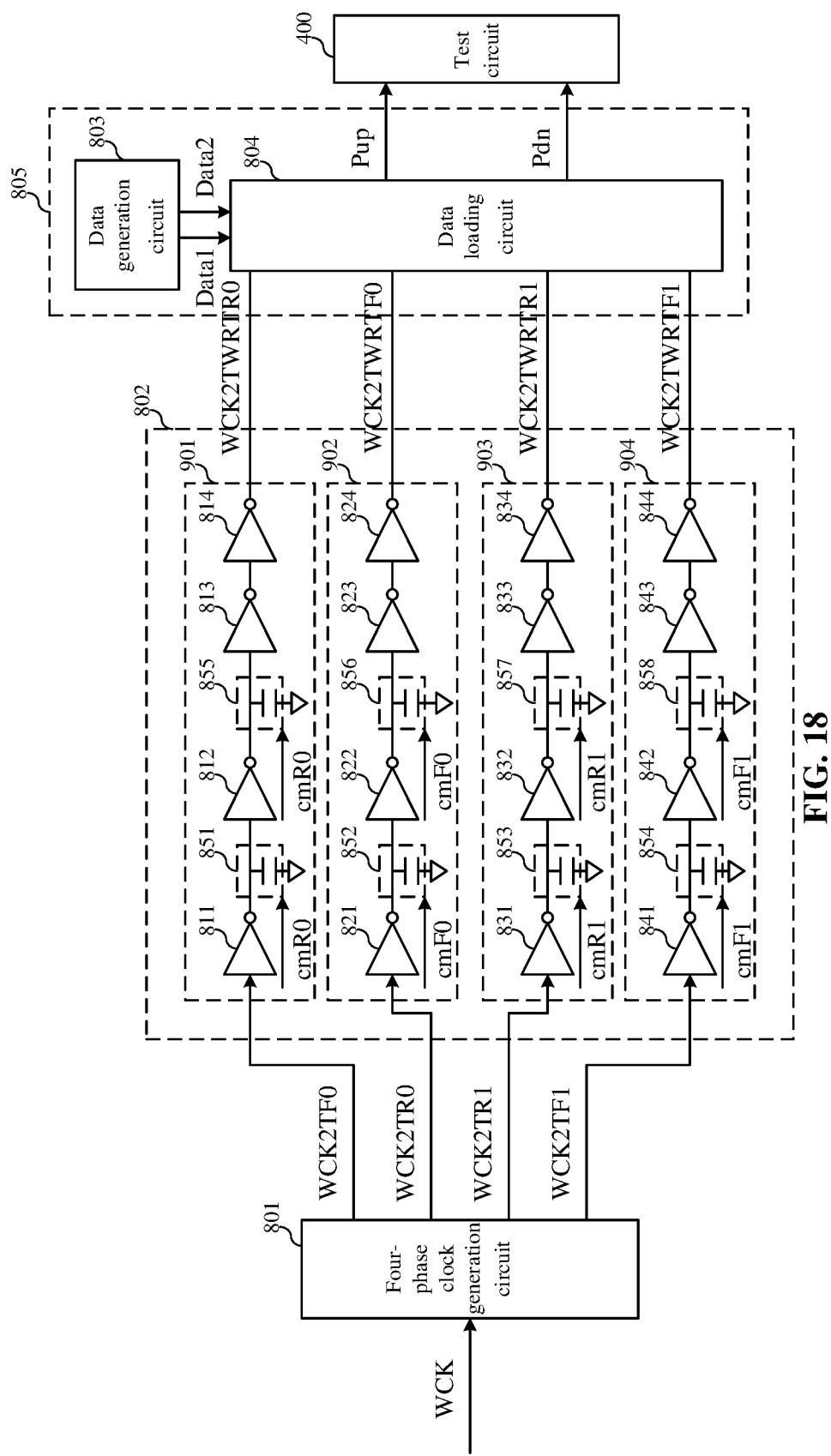
FIG. 18 is a schematic structural diagram of a clock generation circuit according to an embodiment of the disclosure.

For the test logic of testing the write frequency divider 1013 by the test circuit 400, details are as follows: Referring to FIG. 18, the write frequency divider 1013 includes a four-phase clock generation circuit 801, configured to receive the internal clock signal PWCK, and configured to generate the parallel write clock Clk_W based on the internal clock signal PWCK. In this embodiment, the parallel write clock Clk_W is a first clock signal WCK2TF0, a second clock signal WCK2TR0, a third clock signal WCK2TR1, and a fourth clock signal WCK2TF1 with the same period. The write clock tree 1023 includes a signal delay circuit 802, configured to receive the first clock signal WCK2TF0, the second clock signal WCK2TR0, the third clock signal WCK2TR1, the fourth clock signal WCK2TF1, and delay commands, and configured to perform a signal delay on the first clock signal WCK2TF0, the second clock signal WCK2TR0, the third clock signal WCK2TR1, and the fourth clock signal WCK2TF1 separately based on the delay commands, and delays of the first clock signal WCK2TF0, the second clock signal WCK2TR0, the third clock signal WCK2TR1, and the fourth clock signal WCK2TF1 are different.

Figure 19:
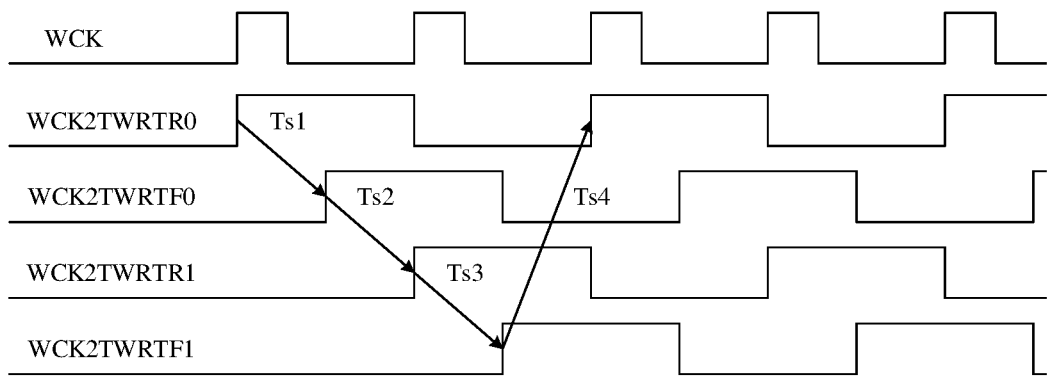
FIG. 19 is a schematic timing diagram of a four-phase signal according to an embodiment of the disclosure.
Figure 20:
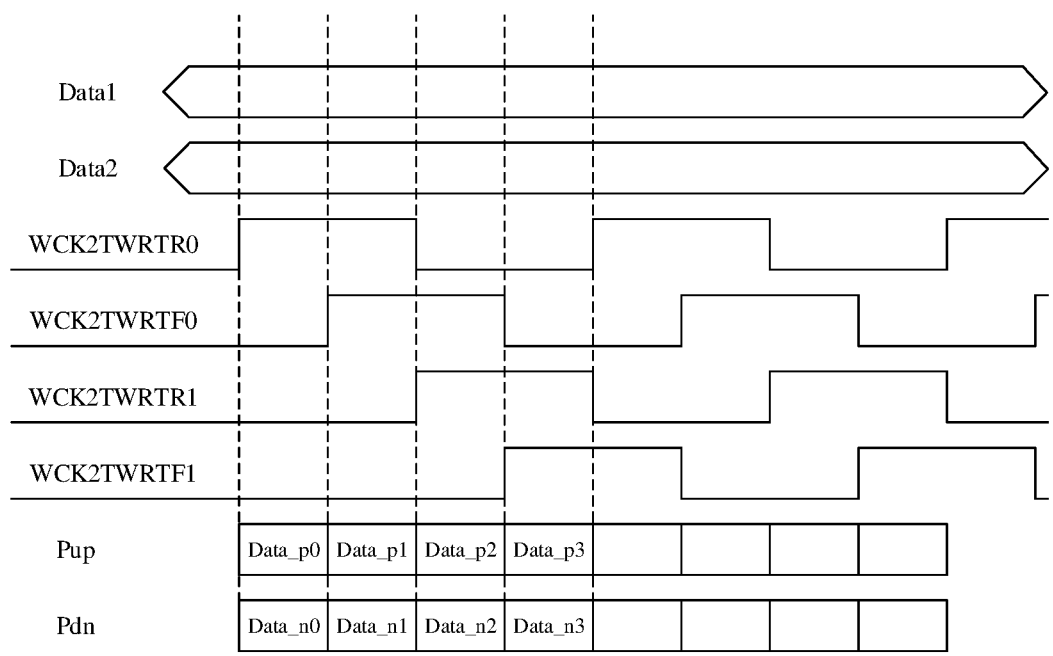
FIG. 20 is a schematic timing diagram of generating an equidistant four-phase signal according to an embodiment of the disclosure.

In an example, a signal delay inside the four-phase clock generation circuit 801 is relatively large, and a K value corresponding to the four-phase clock generation circuit 801 is relatively large. In this case, the period of the generated first clock signal WCK2TR0 may be five or more times the period of the internal clock signal PWCK. In another example, a signal delay inside the four-phase clock generation circuit 801 is relatively small, and a K value corresponding to the four-phase clock generation circuit 801 is relatively small. In this case, the period of the generated first clock signal WCK2TR0 may be four or fewer times the period of the internal clock signal PWCK. Referring to FIG. 19 and FIG. 20, it needs to be noted that double-edge sampling is usually used in a memory. That is, data sampling is performed at both a rising edge and a falling edge of a signal. That is, data is transmitted twice within one clock period. During subsequent division into four-phase clocks, if sampling is performed once based on every clock, double-edge sampling corresponds to a quantity of times of sampling of the internal clock signal PWCK of two periods. Therefore, in this embodiment, an example in which the period of the generated first clock signal WCK2TR0 is twice the period of the internal clock signal PWCK (that is, K=2) is used for detailed description, which does not constitute a limitation to this embodiment. During specific use, a signal delay of the four-phase clock generation circuit 801 may be correspondingly set according to a frequency of a clock that needs to be generated and a frequency of the internal clock signal PWCK of the memory. It may be understood that because the first clock signal WCK2TR0, the second clock signal WCK2TF0, the third clock signal WCK2TR1, and the fourth clock signal WCK2TF1 have the same period, in this case, the periods of the second clock signal WCK2TF0, the third clock signal WCK2TR1, and the fourth clock signal WCK2TF1 are also twice the period of the internal clock signal PWCK.

The signal delay circuit 802 generates a first delay clock signal WCK2TWRTR0 after delaying the first clock signal WCK2TR0, generates a second delay clock signal WCK2TWRTF0 after delaying the second clock signal WCK2TF0, generates a third delay clock signal WCK2TWRTR1 after delaying the third clock signal WCK2TR1, and generates a fourth delay clock signal WCK2TWRTF1 after delaying the fourth clock signal WCK2TF1. Referring to FIG. 19 and FIG. 20, a delay of the second delay clock signal WCK2TWRTF0 relative to the first delay clock signal WCK2TWRTR0 is Ts1, a delay of the third delay clock signal WCK2TWRTR1 relative to the second delay clock signal WCK2TWRTF0 is Ts2, a delay of the fourth delay clock signal WCK2TWRTF1 relative to the third delay clock signal WCK2TWRTR1 is Ts3, and a delay of the first delay clock signal WCK2TWRTR0 relative to the fourth delay clock signal WCK2TWRTF1 is Ts4.

In this embodiment, the delay commands include a first delay command cmR0, a second delay command cmF0, a third delay command cmR1, and a fourth delay command cmF1. The signal delay circuit 802 includes a first delay subcircuit 901, a second delay subcircuit 902, a third delay subcircuit 903, and a fourth delay subcircuit 904.

The first delay subcircuit 901 is configured to perform a signal delay on the first clock signal WCK2TF0 according to the first delay command cmR0, to generate the first delay clock signal WCK2TWRTR0. The second delay subcircuit 902 is configured to perform a signal delay on the second clock signal WCK2TF0 according to the second delay command cmF0, to generate the second delay clock signal WCK2TWRTF0. The third delay subcircuit 903 is configured to perform a signal delay on the third clock signal WCK2TR1 according to the third delay command cmR1, to generate the third delay clock signal WCK2TWRTR1. The fourth delay subcircuit 904 is configured to perform a signal delay on the fourth clock signal WCK2TF1 according to the fourth delay command cmF1, to generate the fourth delay clock signal WCK2TWRTF1.

In an example, the first delay subcircuit 901 includes: a first I delay inverter 811, having an input terminal configured to receive the first clock signal WCK2TF0; a first II delay inverter 812, having an input terminal connected to the first I delay inverter 811; a first III delay inverter 813, having an input terminal connected to the first II delay inverter 812; a first IV delay inverter 814, having an input terminal connected to the first III delay inverter 813 and an output terminal configured to output a delayed first clock signal, that is, the first delay clock signal WCK2TWRTR0; a first charge-discharge circuit 851, having one end connected to an output terminal of the first I delay inverter 811 and the other end coupled to a low-level power supply node, the low-level power supply node being configured to receive a low level; and a fifth charge-discharge circuit 855, having one end connected to an output terminal of the first II delay inverter 812 and the other end coupled to the low-level power supply node, where the charge-discharge capability of the first charge-discharge circuit 851 and the charge-discharge capability of the fifth charge-discharge circuit 855 are adjusted according to the first delay command cmR0. It needs to be noted that in other embodiments, the other end of the first charge-discharge circuit 851 and the other end of the fifth charge-discharge circuit 855 may be coupled to a high-level power supply node, the high-level power supply node being configured to receive a high level.

In an example, the second delay subcircuit 902 includes: a second I delay inverter 821, having an input terminal configured to receive the second clock signal WCK2TF0; a second II delay inverter 822, having an input terminal connected to the second I delay inverter 821; a second III delay inverter 823, having an input terminal connected to the second II delay inverter 822; a second IV delay inverter 824, having an input terminal connected to the second III delay inverter 823 and an output terminal configured to output a delayed second clock signal, that is, the second delay clock signal WCK2TWRTF0; a second charge-discharge circuit 852, having one end connected to an output terminal of the second I delay inverter 821 and the other end coupled to a low-level power supply node, the low-level power supply node being configured to receive a low level; and a sixth charge-discharge circuit 856, having one end connected to an output terminal of the second II delay inverter 822 and the other end coupled to the low-level power supply node, where the charge-discharge capability of the second charge-discharge circuit 852 and the charge-discharge capability of the sixth charge-discharge circuit 856 are adjusted according to the second delay command cmF0. It needs to be noted that in other embodiments, the other end of the second charge-discharge circuit 852 and the other end of the sixth charge-discharge circuit 856 may be coupled to a high-level power supply node, the high-level power supply node being configured to receive a high level.

In an example, the third delay subcircuit 903 includes: a third I delay inverter 831, having an input terminal configured to receive the third clock signal WCK2TR1; a third II delay inverter 832, having an input terminal connected to the third I delay inverter 831; a third III delay inverter 833, having an input terminal connected to the third II delay inverter 832; a third IV delay inverter 834, having an input terminal connected to the third III delay inverter 833 and an output terminal configured to output a delayed third clock signal, that is, the third delay clock signal WCK2TWRTR1; a third charge-discharge circuit 853, having one end connected to an output terminal of the third I delay inverter 831 and the other end coupled to a low-level power supply node, the low-level power supply node being configured to receive a low level; and a seventh charge-discharge circuit 857, having one end connected to an output terminal of the third II delay inverter 832 and the other end coupled to the low-level power supply node, where the charge-discharge capability of the third charge-discharge circuit 853 and the charge-discharge capability of the seventh charge-discharge circuit 857 are adjusted according to the third delay command cmR1. It needs to be noted that in other embodiments, the other end of the third charge-discharge circuit 853 and the other end of the seventh charge-discharge circuit 857 may be coupled to a high-level power supply node, the high-level power supply node being configured to receive a high level.

In an example, the fourth delay subcircuit 904 includes: a fourth I delay inverter 841, having an input terminal configured to receive the fourth clock signal WCK2TF1; a fourth II delay inverter 842, having an input terminal connected to the fourth I delay inverter 841; a fourth III delay inverter 843, having an input terminal connected to the fourth II delay inverter 842; a fourth IV delay inverter 844, having an input terminal connected to the fourth III delay inverter 843 and an output terminal configured to output a delayed fourth clock signal, that is, the fourth delay clock signal WCK2TWRTF1; a fourth charge-discharge circuit 854, having one end connected to an output terminal of the fourth I delay inverter 841 and the other end coupled to a low-level power supply node, the low-level power supply node being configured to receive a low level; and an eighth charge-discharge circuit 858, having one end connected to an output terminal of the fourth II delay inverter 842 and the other end coupled to the low-level power supply node, where the charge-discharge capability of the fourth charge-discharge circuit 854 and the charge-discharge capability of the eighth charge-discharge circuit 858 are adjusted according to the fourth delay command cmF1. It needs to be noted that in other embodiments, the other end of the fourth charge-discharge circuit 854 and the other end of the eighth charge-discharge circuit 858 may be coupled to a high-level power supply node, the high-level power supply node being configured to receive a high level.

Specifically, for the first charge-discharge circuit 851, the second charge-discharge circuit 852, the third charge-discharge circuit 853, and the fourth charge-discharge circuit 854, if more charges can be stored, the discharge speed is higher, and a delay of the rising edge of the signal is longer. For the fifth charge-discharge circuit 855, the sixth charge-discharge circuit 856, the seventh charge-discharge circuit 857, and the eighth charge-discharge circuit 858, if more charges can be stored, the charge speed is higher, and a delay of the falling edge of the signal is longer. The charge-discharge capability of the first charge-discharge circuit 851, the second charge-discharge circuit 852, the third charge-discharge circuit 853, the fourth charge-discharge circuit 854, the fifth charge-discharge circuit 855, the sixth charge-discharge circuit 856, the seventh charge-discharge circuit 857, and the eighth charge-discharge circuit 858 is adjusted, so that the first clock signal WCK2TF0, the second clock signal WCK2TR0, the third clock signal WCK2TR1, and the fourth clock signal WCK2TF1 have the same period are delayed to different degrees.

Moreover, the first charge-discharge circuit 851 and the fifth charge-discharge circuit 855 are controlled based on the same delay command, that is, the rising edge and the falling edge of the first clock signal WCK2TF0 are delayed to the same degree, to ensure that the duty cycle of the first clock signal WCK2TF0 is not changed. The second charge-discharge circuit 852 and the sixth charge-discharge circuit 856 are controlled based on the same delay command, that is, the rising edge and the falling edge of the second clock signal WCK2TR0 are delayed to the same degree, to ensure that the duty cycle of the second clock signal WCK2TR0 is not changed. The third charge-discharge circuit 853 and the seventh charge-discharge circuit 857 are controlled based on the same delay command, that is, the rising edge and the falling edge of the third clock signal WCK2TR1 are delayed to the same degree, to ensure that the duty cycle of the third clock signal WCK2TR1 is not changed. The fourth charge-discharge circuit 854 and the eighth charge-discharge circuit 858 are controlled based on the same delay command, that is, the rising edge and the falling edge of the fourth clock signal WCK2TF1 are delayed to the same degree, to ensure that the duty cycle of the fourth clock signal WCK2TF1 is not changed.

In this embodiment, the first charge-discharge circuit 851, the second charge-discharge circuit 852, the third charge-discharge circuit 853, the fourth charge-discharge circuit 854, the fifth charge-discharge circuit 855, the sixth charge-discharge circuit 856, the seventh charge-discharge circuit 857, and the eighth charge-discharge circuit 858 are implemented by capacitors. The charge-discharge capability of a capacitor depends on a maximum storage charge amount C and a discharge current I of the capacitor. Specifically, the discharge current I is controlled by one bias transistor. Delay commands cm controls the discharge current I to control the delay performance of the corresponding first charge-discharge circuit 851, second charge-discharge circuit 852, third charge-discharge circuit 853, fourth charge-discharge circuit 854, fifth charge-discharge circuit 855, sixth charge-discharge circuit 856, seventh charge-discharge circuit 857, and eighth charge-discharge circuit 858.

It needs to be noted that in some embodiments, the low levels received by the low-level power supply nodes coupled to the first delay subcircuit 901, the second delay subcircuit 902, the third delay subcircuit 903, and the fourth delay subcircuit 904 are adjustable, thereby implementing the overall adjustment of the charge-discharge capability of the first delay subcircuit 901, the second delay subcircuit 902, the third delay subcircuit 903, and the fourth delay subcircuit 904.

In an ideal case, the signal delay circuit 802 may generate an equidistant (Ts1=Ts2=Ts3=Ts4) four-phase clock signals. However, due to reasons such as a deviation in an actual device, corresponding delays of the four-phase clock signals generated by the signal delay circuit 802 are not equal, that is, it cannot be ensured that Ts1=Ts2=Ts3=Ts4.

The signal loading circuit 805 generate the first indication signal Pup and the second indication signal Pdn based on the first delay clock signal WCK2TWRTR0, the second delay clock signal WCK2TWRTF0, the third delay clock signal WCK2TWRTR1, and the fourth delay clock signal WCK2TWRTF1. Specifically, referring to FIG. 18, the signal loading circuit 805 includes: a data generation circuit 803, configured to generate four-bit first loading data Data1 and four-bit second loading data Data2; and a data loading circuit 804, configured to sample the first loading data Data1 according to the delayed first clock signal, second clock signal, third clock signal, and fourth clock signal to generate the first indication signal Pup, where when first loading data Data1 corresponding to a sampling edge of each of the first clock signal, the second clock signal, the third clock signal, and the fourth clock signal is at a high level, the generated first indication signal Pup is at a high level; and when the first loading data Data1 corresponding to the sampling edge of each of the first clock signal, the second clock signal, the third clock signal, and the fourth clock signal is at a low level, the generated first indication signal Pup is at a high level. The data loading circuit 804 is further configured to sample the second loading data Data2 according to the delayed first clock signal, second clock signal, third clock signal, and fourth clock signal to generate the second indication signal Pdn, where when second loading data Data2 corresponding to a sampling edge of each of the first clock signal, the second clock signal, the third clock signal, and the fourth clock signal is at a high level, the generated second indication signal Pdn is at a high level. For the data generation circuit 803, the generated first loading data Data1 and four-bit second loading data Data2 have a quantity of bits equal to that of the first clock signal, the second clock signal, the third clock signal, and the fourth clock signal driving the data loading circuit 804. In this embodiment, the data loading circuit 804 may be driven by four clock signals. Therefore, the first loading data Data1 and the second loading data Data2 both have four bits. In some embodiments, the data generation circuit 803 is controlled based on the test control signal to be turned on. It is controlled that the data generation circuit is turned on only during use, thereby reducing the power consumption of the clock generation circuit.

The test circuit 400 is connected to the signal loading circuit 805, and is configured to perform the duty cycle test based on the first indication signal Pup and the second indication signal Pdn. Specifically, an output signal of the test circuit 400 is used for representing a value relationship between the first indication signal Pup and the second indication signal Pdn. If the output signal of the test circuit is at a high level, the first indication signal Pup is greater than the second indication signal Pdn. If the output signal of the test circuit is at a low level, the second indication signal Pdn is not less than the first indication signal Pup.

Specifically, the first indication signal Pup is generated based on the first delay clock signal WCK2TWRTR0, the second delay clock signal WCK2TWRTF0, and the third delay clock signal WCK2TWRTR1 obtained through delaying. The second indication signal Pdn is generated based on the third delay clock signal WCK2TWRTR1, the fourth delay clock signal WCK2TWRTF1, and the first delay clock signal WCK2TWRTR0 obtained through delaying. As can be known from FIG. 19 and FIG. 20, in this case, the duty cycle of the first indication signal Pup is (Ts1+Ts2)/(Ts1+Ts2+Ts3+Ts4), and the duty cycle of the second indication signal Pdn is (Ts3+Ts4)/(Ts1+Ts2+Ts3+Ts4). If the output signal of the test circuit 400 is at a high level, it is proved that the duty cycle of the first indication signal Pup is greater than the duty cycle of the second indication signal Pdn, that is, (Ts1+Ts2)> (Ts3+Ts4). In this case, the delay of the first clock signal may be increased and at the same time delays of the second clock signal and the third clock signal are reduced, that is, Ts1+Ts2 is reduced and Ts3+Ts4 is increased, to keep (Ts1+Ts2)=(Ts3+Ts4) and a sum of Ts1+Ts2+Ts3+Ts4 unchanged, so that the overall period of the four-phase clock signals is not changed. If the output signal of the test circuit 400 is at a low level, it is proved that the duty cycle of the first indication signal Pup is less than the duty cycle of the second indication signal Pdn, that is, (Ts1+Ts2)< (Ts3+Ts4). In this case, the delay of the first clock signal may be reduced and at the same time delays of the second clock signal and the third clock signal are increased, that is, Ts1+Ts2 is increased and Ts3+Ts4 is reduced, to keep (Ts1+Ts2)=(Ts3+Ts4) and a sum of Ts1+Ts2+Ts3+Ts4 unchanged, so that the overall period of the four-phase clock signals is not changed. It needs to be noted that the foregoing example does not reflect sampling of a delay clock signal in which the first indication signal Pup and the second indication signal Pdn are not related to a duty cycle result. During actual application, the first indication signal Pup and the second indication signal Pdn are both adopted based on the first delay clock signal WCK2TWRTR0, the second delay clock signal WCK2TWRTF0, the third delay clock signal WCK2TWRTR1, and the fourth delay clock signal WCK2TWRTF1.

A third indication signal Pup is generated based on the delayed the first delay clock signal WCK2TWRTR0 and the second delay clock signal WCK2TWRTF0, and a fourth indication signal Pdn is generated based on the delayed second delay clock signal WCK2TWRTF0 and the third delay clock signal WCK2TWRTR1. With reference to FIG. 19 and FIG. 20, in this case, the duty cycle of the third indication signal Pup is Ts1/(Ts1+Ts2), and the duty cycle of the fourth indication signal Pdn is Ts2/(Ts1+Ts2). If the output signal of the test circuit 400 is at a high level, it is proved that the duty cycle of the third indication signal Pup is greater than the duty cycle of the fourth indication signal Pdn, that is, Ts1>Ts2. In this case, the delay of the first clock signal may be increased and the delay of the second clock signal may be reduced, that is, Ts1 is reduced and Ts2 is increased, to keep Ts1=Ts2 and a total delay of the first clock signal and the second clock signal unchanged, that is, a sum of Ts1+Ts2 unchanged, to ensure that (Ts1+Ts2)=(Ts3+Ts4). If the output signal of the test circuit 400 is at a low level, it is proved that the duty cycle of the third indication signal Pup is less than the duty cycle of the fourth indication signal Pdn, that is, Ts1<Ts2. In this case, the delay of the first clock signal may be reduced and the delay of the second clock signal may be increased, that is, Ts1 is increased and Ts2 is reduced, to keep Ts1=Ts2 and a total delay of the first clock signal and the second clock signal unchanged, that is, a sum of Ts1+Ts2 unchanged, to ensure that (Ts1+Ts2)=(Ts3+Ts4). It needs to be noted that the foregoing example does not reflect sampling of a delay clock signal in which the third indication signal Pup and the fourth indication signal Pdn are not related to a duty cycle result. During actual application, the first indication signal Pup and the third indication signal Pdn are both adopted based on the first delay clock signal WCK2TWRTR0, the second delay clock signal WCK2TWRTF0, the third delay clock signal WCK2TWRTR1, and the fourth delay clock signal WCK2TWRTF1.

A fifth indication signal Pup is generated based on the delayed the third delay clock signal WCK2TWRTR1 and the fourth delay clock signal WCK2TWRTF1, and a sixth indication signal Pdn is generated based on the delayed fourth delay clock signal WCK2TWRTF1 and the first delay clock signal WCK2TWRTR0. With reference to FIG. 19 and FIG. 20, in this case, the duty cycle of the fifth indication signal Pup is Ts3/(Ts3+Ts4), and the duty cycle of the sixth indication signal Pdn is Ts4/(Ts3+Ts4). If the output signal of the test circuit 400 is at a high level, it is proved that the duty cycle of the fifth indication signal Pup is greater than the duty cycle of the sixth indication signal Pdn, that is, Ts3>Ts4. In this case, the delay of the third clock signal may be increased and the delay of the fourth clock signal may be reduced, that is, Ts3 is reduced and Ts4 is increased, to keep Ts3=Ts4 and a total delay of the third clock signal and the fourth clock signal unchanged, that is, a sum of Ts3+Ts4 unchanged, to ensure that (Ts1+Ts2)=(Ts3+Ts4). If the output signal of the test circuit 400 is at a low level, it is proved that the duty cycle of the fifth indication signal Pup is less than the duty cycle of the sixth indication signal Pdn, that is, Ts3<Ts4. In this case, the delay of the third clock signal may be increased and the delay of the fourth clock signal may be reduced, that is, Ts3 is increased and Ts4 is reduced, to keep Ts3=Ts4 and a total delay of the third clock signal and the fourth clock signal unchanged, that is, a sum of Ts3+Ts4 unchanged, to ensure that (Ts1+Ts2)=(Ts3+Ts4). It needs to be noted that the foregoing example does not reflect sampling of a delay clock signal in which the fifth indication signal Pup and the sixth indication signal Pdn are not related to a duty cycle result. During actual application, the fifth indication signal Pup and the sixth indication signal Pdn are both adopted based on the first delay clock signal WCK2TWRTR0, the second delay clock signal WCK2TWRTF0, the third delay clock signal WCK2TWRTR1, and the fourth delay clock signal WCK2TWRTF1.

It needs to be noted that the foregoing example describes a case in which the delays of the first clock signal, the second clock signal, the third clock signal, and the fourth clock signal are all adjustable. During specific implementation, because a rising edge of the first clock signal WCK2TR0 needs to be aligned with a rising edge of the internal clock signal PWCK, that is, the delay of the first clock signal WCK2TR0 cannot be adjusted. In this case, a change in the delay of the first clock signal WCK2TR0 is ignored, and the foregoing example is still applicable.

Continuing to refer to FIG. 1, in some embodiments, the memory further includes a second output component 1200, connected to an output terminal of the write clock tree 1023, and configured to output the parallel write clock Clk_W to the external test system 10, the external test system 10 being configured to test whether the parallel write clock Clk_W is an equidistant clock. That is, after the write clock tree 1023, the signal loading circuit 805, and the test circuit 400 are tested and adjusted, it is determined whether the actually obtained parallel write clock Clk_W is an equidistant clock.

In this case, one value in the test control signal is configured to control the memory to output the parallel write clock outputted by the write clock path 1003 to the external test system 10 to perform the duty cycle detection. In this case, the turn-on signal PathEns is used for making a data transmission path between the signal generator 100 and the signal conversion circuit 1002, a data transmission path between the signal conversion circuit 1002 and the write clock path 1003, and a data transmission path between the write clock path 1003 and the external test system, to determine whether the parallel write clock Clk_W is an equidistant clock.

In some embodiments, the signal conversion circuit 1002 is further configured to receive an external clock signal WCK with the preset duty cycle and generate the internal clock signal PWCK according to the external clock signal WCK. The external clock signal WCK is a clock signal that needs to be received when the memory operates normally.

Correspondingly, referring to FIG. 1, the memory further includes: a selection circuit 1001, having a first input terminal, a second input terminal, and an output terminal, the first input terminal being configured to receive the reference test signal AltWck, the second input terminal being configured to receive the external clock signal WCK, the output terminal being connected to an input terminal of the signal conversion circuit 1002, the control terminal being configured to receive the test control signal DcmCtrl and connect the first input terminal and the output terminal or connect the second input terminal and the output terminal based on the test control signal DemCtrl.

Figure 21:
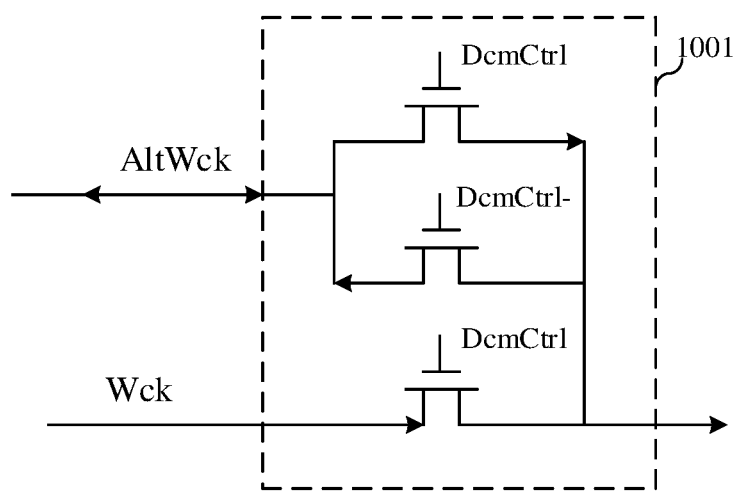
FIG. 21 is a specific schematic structural diagram of a selection circuit according to an embodiment of the disclosure.

In an example, referring to FIG. 21, a first input MOS transistor has a source electrode connected to an output terminal of the amplitude adjustment circuit 103 and a drain electrode configured to output the reference test signal AltWck. A second input MOS transistor has a source electrode connected to the drain electrode of the first input MOS transistor and a drain electrode connected to the source electrode of the first input MOS transistor. A third input MOS transistor has a source electrode configured to receive the external clock signal WCK and a drain electrode connected to the drain electrode of the first input MOS transistor and configured to output the external clock signal WCK. A gate electrode of the first input MOS transistor, a gate electrode of the second input MOS transistor, and a gate electrode of the third input MOS transistor are configured to receive the test control signal DemCtrl, and signals received by the gate electrode of the first input MOS transistor and the gate electrode of the second input MOS transistor are inverted signals. That is, the gate electrode of one of the first input MOS transistor and the second input MOS transistor is configured to receive the test control signal DcmCtrl, and the gate electrode of the other is configured to receive inverted test control signal DcmCtrl-. In some embodiments, only one of the first input MOS transistor and the third input MOS transistor receives a clock signal. In this case, the two can be turned on simultaneously. In some other embodiments, the first input MOS transistor and the third input MOS transistor are alternately turned on.

Correspondingly, continuing to refer to FIG. 1, for the test control signal DcmCtrl, details are as follows:

One value in the test control signal DcmCtrl is configured to control the memory to output the generated intermediate test signal Pretest to the external test system to perform a duty cycle detection. In this case, the turn-on signal PathEns is used for making a data transmission path between the signal generator 100 and the external test system 10, to obtain the reference test signal AltWck with a duty cycle satisfying the preset duty cycle.

One value in the test control signal DcmCtrl is configured to select, based on the test circuit, to perform the duty cycle test on the reference test signal AltWck. In this case, the turn-on signal PathEns is used for making a data transmission path between the signal generator 100 and the test circuit 400, to use the reference test signal AltWck with a known duty cycle to test whether the test function of the test circuit 400 is normal.

One value in the test control signal DcmCtrl is configured to select to perform, based on the test circuit 400, the duty cycle test on the internal clock signal PWCK outputted by the signal conversion circuit 1002 based on the reference test signal AltWck. In this case, the turn-on signal PathEns is used for making a data transmission path between the signal generator 100 and the selection circuit 1001, a data transmission path between selection circuit 1001 and the signal conversion circuit 1002, and a data transmission path between the signal conversion circuit 1002 and the test circuit 400, to use the test circuit 400 to test whether the function of the signal conversion circuit 1002 when operating based on the reference test signal AltWck is normal.

One value in the test control signal DcmCtrl is configured to select to perform, based on the test circuit 400, the duty cycle test on the internal clock signal PWCK outputted by the signal conversion circuit 1002 based on the internal clock signal PWCK. In this case, the turn-on signal PathEns is used for making a data transmission path between the selection circuit 1001 and a data pad (configured to receive the external clock signal WCK), a data transmission path between selection circuit 1001 and the signal conversion circuit 1002, and a data transmission path between the signal conversion circuit 1002 and the test circuit 400, to use the test circuit 400 to test whether the function of the signal conversion circuit 1002 when operating based on the external clock signal WCK is normal.

One value in the test control signal DcmCtrl is configured to select to perform, based on the test circuit 400, the duty cycle test on the serial read clock Clk_R2 outputted by the read clock path 1004 based on the reference test signal AltWck. In this case, the turn-on signal PathEns is used for making a data transmission path between the signal generator 100 and the selection circuit 1001, a data transmission path between the selection circuit 1001 and the signal conversion circuit 1002, a data transmission path between the signal conversion circuit 1002 and the read clock path 1004, and a data transmission path between the read clock path 1004 and the test circuit 400, to use the test circuit 400 to test whether the function of the read clock path 1004 when operating based on the reference test signal AltWck is normal.

One value in the test control signal DemCtrl is configured to select to perform, based on the test circuit 400, the duty cycle test on the serial read clock Clk_R2 outputted by the read clock path 1004 based on the external clock signal WCK. In this case, the turn-on signal PathEns is used for making a data transmission path between the selection circuit 1001 and a data pad (configured to receive the external clock signal WCK), a data transmission path between the selection circuit 1001 and the signal conversion circuit 1002, a data transmission path between the signal conversion circuit 1002 and the read clock path 1004, and a data transmission path between the read clock path 1004 and the test circuit 400, to use the test circuit 400 to test whether the function of the read clock path 1004 when operating based on the external clock signal WCK is normal.

One value in the test control signal DemCtrl is configured to select to perform, based on the test circuit 400, the duty cycle test on the first indication signal Pup and the second indication signal Pdn outputted by the write clock path 1003 based on the reference test signal AltWck. In this case, the turn-on signal PathEns is used for making a data transmission path between the signal generator 100 and the selection circuit 1001, a data transmission path between the selection circuit 1001 and the signal conversion circuit 1002, a data transmission path between the signal conversion circuit 1002 and the write clock path 1003, and a data transmission path between the write clock path 1003 and the test circuit 400, to repeatedly perform tests and adjustments to generate an equidistant parallel write clock Clk_W based on the reference test signal AltWck.

One value in the test control signal DemCtrl is configured to select to perform, based on the test circuit 400, the duty cycle test on the first indication signal Pup and the second indication signal Pdn outputted by the write clock path 1003 based on the external clock signal WCK. In this case, the turn-on signal PathEns is used for making a data transmission path between the selection circuit 1001 and a data pad (configured to receive the external clock signal WCK), a data transmission path between the selection circuit 1001 and the signal conversion circuit 1002, a data transmission path between the signal conversion circuit 1002 and the write clock path 1003, and a data transmission path between the write clock path 1003 and the test circuit 400, to repeatedly perform tests and adjustments to generate an equidistant parallel write clock Clk_W based on the external clock signal WCK.

One value in the test control signal DcmCtrl is configured to control the memory to output the parallel write clock Clk_W generated based on the reference test signal AltWck to the external test system 10 to perform the duty cycle detection. In this case, the turn-on signal PathEns is used for making a data transmission path between the signal generator 100 and the selection circuit 1001, a data transmission path between the selection circuit 1001 and the signal conversion circuit 1002, a data transmission path between the signal conversion circuit 1002 and the write clock path 1003, and a data transmission path between the write clock path 1003 and the external test system, to determine whether the parallel write clock Clk_W generated based on the reference test signal AltWck is an equidistant clock.

One value in the test control signal DemCtrl is configured to control the memory to output the parallel write clock Clk_W generated based on the external clock signal WCK to the external test system 10 to perform the duty cycle detection. In this case, the turn-on signal PathEns is used for making a data transmission path between the selection circuit 1001 and a data pad (configured to receive the external clock signal WCK), a data transmission path between the selection circuit 1001 and the signal conversion circuit 1002, a data transmission path between the signal conversion circuit 1002 and the write clock path 1003, and a data transmission path between the write clock path 1003 and the external test system, to determine whether the parallel write clock Clk_W generated based on the external clock signal WCK is an equidistant clock.

It needs to be noted that "the driving capability" in the embodiments of the disclosure is a driving capability of a source-drain current of a transistor when a gate electrode of the transistor is turned on to the same degree.

In this embodiment, the duty cycle test is performed on the reference test signal AltWck based on the test circuit 400. A duty cycle of the reference test signal AltWck is known and is used for determining whether a duty cycle test function of the test circuit 400 is normal. If the duty cycle test function of the test circuit 400 is normal, different portions under test are selected based on a test control signal DemCtrl, and duty cycles of an output signals of the different portions under test are sequentially tested by using the test circuit 400, to test whether the duty cycle of the output signal of each of the different portions under test is normal, thereby completing a function test for the different portions under test.

It needs to be noted that the features disclosed in the signal detection system provided in the foregoing embodiments may be arbitrarily combined with each other without causing any conflict to obtain new embodiments of the signal detection system.

Another embodiment of the disclosure provides a memory detection method, performing a duty cycle test on output signals of test paths in a memory based on the signal detection system provided in the foregoing embodiments. Different test paths are selected to test whether duty cycles of a high-speed clock signal in different transmission paths meets requirements, to ensure the stability of data processing in a memory.

A person of ordinary skill in the art may understand that the foregoing embodiments are specific embodiments for implementing the disclosure, and in actual applications, various changes can be made thereto in forms and details without departing from the spirit and scope of the disclosure.

The invention claimed is:

1. A signal detection system, applied to a memory, configured to perform a duty cycle test on output signals of test paths in the memory according to a test circuit in the memory, and comprising:
   a signal generator, configured to generate a reference test signal based on an external parameter, the reference test signal being a clock signal satisfying a preset duty cycle, wherein the duty cycle test is performed on the reference test
signal based on the test circuit, to determine whether a
function of the test circuit is normal;

in response to determining that the function of the test
circuit is normal, different portions under test are
sequentially selected based on a test control signal, and
the duty cycle test is performed, based on the test
circuit, on a signal outputted by each of the selected
portions under test; the portions under test comprise a
signal conversion circuit and a write clock path; the
signal conversion circuit is configured to generate an
internal clock signal according to the reference test
signal; and the write clock path comprises a write
frequency divider, a write clock tree, and a signal
loading circuit; and the write frequency divider is configured to generate a
parallel write clock according to the internal clock
signal, the write clock tree is configured to adjust a
delay of the parallel write clock, and the signal loading
circuit is configured to sample preset data according to
the parallel write clock, to generate a first indication
signal and a second indication signal.

2. The signal detection system according to claim 1, wherein the portions under test further comprise a read clock path, the read clock path comprises a read frequency divider and a read clock conversion circuit, the read frequency divider is configured to generate a parallel read clock according to the internal clock signal, and the read clock conversion circuit is configured to generate a serial read clock according to the parallel read clock.

3. The signal detection system according to claim 2, wherein the memory further comprises a clock driver, having an input terminal connected to an output terminal of the signal converter and an output terminal connected to the test circuit.

4. The signal detection system according to claim 3, wherein the test control signal is set to include at least four bits to form a plurality of signal values, comprising:
a first value, configured for selecting to perform the duty cycle test on the reference test signal based on the test circuit;
a second value, configured for controlling the signal converter to receive the reference test signal and performing, based on the test circuit, the duty cycle test on the internal clock signal outputted by the signal converter;
a third value, configured for selecting to perform, based on the test circuit, the duty cycle test on the serial read clock outputted by the read clock path;
a fourth value, configured for selecting to perform, based on the test circuit, the duty cycle test on the first indication signal and the second indication signal outputted by the write clock path; and
the memory further comprises a logic control signal circuit, configured to recognize the test control signal and generate a turn-on signal corresponding to the test control signal based on the test control signal, the turn-on signal is configured for selecting to turn on a corresponding portion under test to form a different test path, and the different test path outputs a to-be-tested signal to the test circuit or an external test system.

5. The signal detection system according to claim 3, wherein the signal generator comprises:
an oscillation generation circuit, configured to generate an initial oscillation signal based on an oscillation control signal, the oscillation control signal being used for adjusting a frequency of the generated initial oscillation signal;
a duty cycle correction circuit, connected to an output terminal of the oscillation generation circuit, and configured to adjust a duty cycle of the initial oscillation signal based on a duty cycle control signal to generate an intermediate test signal; and
an amplitude adjustment circuit, connected to an output terminal of the duty cycle correction circuit, and configured to adjust an amplitude of the intermediate test signal based on an amplitude control signal to generate the reference test signal.

6. The signal detection system according to claim 5, wherein the memory comprises:
a first output component, connected to the output terminal of the duty cycle correction circuit, and configured to output the intermediate test signal to an external test system, the external test system being configured to test whether the intermediate test signal satisfies the preset duty cycle.

7. The signal detection system according to claim 5, wherein the memory comprises:
the signal converter, further configured to receive an external clock signal with the preset duty cycle and generate the internal clock signal according to the external clock signal; and
a second output component, connected to an output terminal of the write clock tree, and configured to output the parallel write clock to an external test system, the external test system being configured to test whether the parallel write clock is an equidistant clock.

8. The signal detection system according to claim 7, wherein the memory further comprises:
a selection circuit, having a first input terminal, a second input terminal, and an output terminal, the first input terminal being configured to receive the reference test signal, the second input terminal being configured to receive the external clock signal, the output terminal being connected to an input terminal of the signal converter and being configured to receive the test control signal and connect the first input terminal and the output terminal or connect the second input terminal and the output terminal based on the test control signal.

9. The signal detection system according to claim 8, wherein the selection circuit comprises:
a first input MOS transistor, having a source electrode connected to an output terminal of the amplitude adjustment circuit and a drain configured to output the reference test signal;
a second input MOS transistor, having a source electrode connected to the drain electrode of the first input MOS transistor and a drain electrode connected to the source electrode of the first input MOS transistor; and
a third input MOS transistor, having a source electrode configured to receive the external clock signal and a drain electrode connected to the drain electrode of the first input MOS transistor and configured to output the external clock signal,
wherein a gate electrode of the first input MOS transistor, a gate electrode of the second input MOS transistor, and a gate electrode of the third input MOS transistor are configured to receive the test control signal, and signals received by the gate electrode of the first input MOS transistor and the gate electrode of the second input MOS transistor are inverted signals.

10. The signal detection system according to claim 8, wherein the test control signal is further set to form a plurality of signal values, comprising:
- a fifth value, configured for controlling the memory to output the generated intermediate test signal to the external test system to perform a duty cycle detection;
- a sixth value, configured for selecting to perform the duty cycle test on the reference test signal based on the test circuit;
- a seventh value, configured for controlling the memory to output the parallel write clock generated based on the external clock signal to the external test system to perform the duty cycle detection;
- an eighth value, configured for controlling the memory to output the parallel write clock generated based on the reference test signal to the external test system to perform the duty cycle detection;
- a ninth value, configured for selecting to perform, based on the test circuit, the duty cycle test on the internal clock signal outputted by the signal converter based on the reference test signal;
- a tenth value, configured for selecting to perform, based on the test circuit, the duty cycle test on the internal clock signal outputted by the signal converter based on the external clock signal;
- an eleventh value, configured for selecting to perform, based on the test circuit, the duty cycle test on the serial read clock outputted by the read clock path based on the reference test signal;
- a twelfth value, configured for selecting to perform, based on the test circuit, the duty cycle test on the first indication signal and the second indication signal outputted by the write clock path based on the reference test signal;
- a thirteenth value, configured for selecting to perform, based on the test circuit, the duty cycle test on the serial read clock outputted by the read clock path based on the external clock signal; and
- a fourteenth value, configured for selecting to perform, based on the test circuit, the duty cycle test on the first indication signal and the second indication signal outputted by the write clock path based on the external clock signal.

11. The signal detection system according to claim 5, wherein the amplitude adjustment circuit comprises:
- a first signal generation unit, configured to pull up an output signal based on the intermediate test signal and pull down an output signal based on an inverted test signal to generate the reference test signal with a same phase as the intermediate test signal; and
- a second signal generation unit, configured to pull up an output signal based on the inverted test signal and pull down an output signal based on the intermediate test signal to generate an inverted reference test signal with a same phase as the inverted test signal,
- wherein the intermediate test signal and the inverted test signal have a same amplitude but opposite phases.

12. The signal detection system according to claim 1, wherein
- the write frequency divider comprises a four-phase clock generation circuit, configured to receive the internal clock signal, and configured to generate a first clock signal, a second clock signal, a third clock signal, and a fourth clock signal with a same period based on the internal clock signal; and
- the write clock tree comprises a signal delay circuit, configured to receive the first clock signal, the second clock signal, the third clock signal, the fourth clock signal, and delay commands, and configured to perform a signal delay on the first clock signal, the second clock signal, the third clock signal, and the fourth clock signal separately based on the delay commands, wherein delays of the first clock signal, the second clock signal, the third clock signal, and the fourth clock signal are different.

13. The signal detection system according to claim 12, wherein
- the delay commands comprise a first delay command, a second delay command, a third delay command, and a fourth delay command; the delay circuit comprises a first delay subcircuit, a second delay subcircuit, a third delay subcircuit, and a fourth delay subcircuit; and
- wherein the first delay subcircuit is configured to perform signal delay on the first clock signal according to the first delay command, the second delay subcircuit is configured to perform signal delay on the second clock signal according to the second delay command, the third delay subcircuit is configured to perform signal delay on the third clock signal according to the third delay command, and the fourth delay subcircuit is configured to perform signal delay on the fourth clock signal according to the fourth delay command.

14. The signal detection system according to claim 12, wherein the signal loading circuit comprises:
- a data generation circuit, configured to generate four-bit first loading data and four-bit second loading data; and
- a data loading circuit, configured to sample the first loading data according to the first clock signal, the second clock signal, the third clock signal, and the fourth clock signal to generate the first indication signal, wherein when first loading data corresponding to a sampling edge of each of the first clock signal, the second clock signal, the third clock signal, and the fourth clock signal is at a high level, the generated first indication signal is at a high level;
- wherein the data loading circuit is further configured to sample the second loading data according to the first clock signal, the second clock signal, the third clock signal, and the fourth clock signal to generate the second indication signal, wherein when second loading data corresponding to the sampling edge of each of the first clock signal, the second clock signal, the third clock signal, and the fourth clock signal is at a high level, the generated second indication signal is at the high level.

15. A memory detection method, for performing a duty cycle test on output signals of test paths in a memory based on a signal detection system, the method comprising:
- generating, by a signal generator in the signal detection system, a reference test signal based on an external parameter, the reference test signal being a clock signal satisfying a preset duty cycle, wherein
- performing the duty cycle test on the reference test signal based on the test circuit, to determine whether a function of the test circuit is normal;
- in response to determining that the function of the test circuit is normal,
- sequentially selecting different portions under test based on a test control signal,
- performing, based on the test circuit, the duty cycle test on a signal outputted by each of the selected portions under test, wherein the portions under test comprise a signal conversion circuit and a write clock path, generating, by the signal conversion circuit, an internal clock signal according to the reference test signal;

generating, by a write frequency divider in the write clock path, a parallel write clock according to the internal clock signal;

adjusting, by a write clock tree in the write clock path, a delay of the parallel write clock, and sampling, by a signal loading circuit in the write clock path, preset data according to the parallel write clock, to generate a first indication signal and a second indication signal.

16. The memory detection method according to claim 15, wherein the portions under test further comprise a read clock path, and the method further comprises:

generating, by a read frequency divider in the read clock path, a parallel read clock according to the internal clock signal, and generating, by a read clock conversion circuit in the read clock path, a serial read clock according to the parallel read clock.

17. The memory detection method according to claim 16, wherein the generating, by the signal generator in the signal detection system, the reference test signal based on the external parameter comprises:

generating an initial oscillation signal based on an oscillation control signal, the oscillation control signal being used for adjusting a frequency of the generated initial oscillation signal;

adjusting a duty cycle of the initial oscillation signal based on a duty cycle control signal to generate an intermediate test signal; and adjusting an amplitude of the intermediate test signal based on an amplitude control signal to generate the reference test signal.

18. The memory detection method according to claim 17, further comprising:

outputting the intermediate test signal to an external test system, the external test system being configured to test whether the intermediate test signal satisfies the preset duty cycle.

19. The memory detection method according to claim 17, further comprising:

receiving an external clock signal with the preset duty cycle and generating the internal clock signal according to the external clock signal; and outputting the parallel write clock to an external test system, the external test system being configured to test whether the parallel write clock is an equidistant clock.

20. The signal detection system according to claim 15, wherein the generating, by the write frequency divider in the write clock path, the parallel write clock according to the internal clock signal comprises:

receiving the internal clock signal, and configured to generating a first clock signal, a second clock signal, a third clock signal, and a fourth clock signal with a same period based on the internal clock signal; and wherein adjusting, by the write clock tree in the write clock path, the delay of the parallel write clock comprises:

receiving the first clock signal, the second clock signal, the third clock signal, the fourth clock signal, and delay commands, and performing a signal delay on the first clock signal, the second clock signal, the third clock signal, and the fourth clock signal separately based on the delay commands, wherein delays of the first clock signal, the second clock signal, the third clock signal, and the fourth clock signal are different.

* * * * *